United States Patent
Awano et al.

(10) Patent No.: US 10,667,447 B2
(45) Date of Patent: May 26, 2020

(54) COMPONENTS FEEDER

(71) Applicant: Yamaha Hatsudoki Kabushiki Kaisha, Iwata-shi, Shizuoka (JP)

(72) Inventors: Yukinari Awano, Iwata (JP); Tsutomu Yanagida, Iwata (JP)

(73) Assignee: YAMAHA HATSUDOKI KABUSHIKI KAISHA, Shizuoka (JP)

( * ) Notice: Subject to any disclaimer, the term of this patent is extended or adjusted under 35 U.S.C. 154(b) by 0 days.

(21) Appl. No.: 16/085,915

(22) PCT Filed: Mar. 30, 2016

(86) PCT No.: PCT/JP2016/060436
§ 371 (c)(1),
(2) Date: Sep. 17, 2018

(87) PCT Pub. No.: WO2017/168641
PCT Pub. Date: Oct. 5, 2017

(65) Prior Publication Data
US 2019/0104654 A1    Apr. 4, 2019

(51) Int. Cl.
*B32B 43/00*   (2006.01)
*H05K 13/02*   (2006.01)
(Continued)

(52) U.S. Cl.
CPC ......... *H05K 13/02* (2013.01); *H05K 13/0419* (2018.08); *B32B 38/10* (2013.01);
(Continued)

(58) Field of Classification Search
CPC . B32B 38/10; B32B 43/006; Y10T 156/1184; Y10T 156/1961;
(Continued)

(56) References Cited

U.S. PATENT DOCUMENTS

| 4,820,369 A | * | 4/1989 | Kubo | ................. H05K 13/0419 156/716 |
| 6,082,603 A | * | 7/2000 | Takada | ............... H05K 13/0417 226/157 |

(Continued)

FOREIGN PATENT DOCUMENTS

| JP | 2011-029260 A | 2/2011 |
| JP | 2013-150020 A | 8/2013 |

(Continued)

OTHER PUBLICATIONS

International Search Report issued in PCT/JP2016/060436; dated Jul. 5, 2016.

(Continued)

*Primary Examiner* — Mark A Osele
*Assistant Examiner* — Nickolas R Harm
(74) *Attorney, Agent, or Firm* — Studebaker & Brackett PC

(57) ABSTRACT

A component feeder for feeding components to a component feeding position using a component feeding tape including a carrier tape holding the components at equal intervals and a covering tape attached to the upper surface of the carrier tape. The component feeder includes a driving sprocket and a tape guide. The driving sprocket is configured to feed the component feeding tape to the component feeding portions. The tape guide includes a pressing surface to press an upper surface of the component feeding tape fed to the component feeding position. The tape guide includes a component exposing portion and an adjustment portion. The component exposing portion includes an inserting portion to be inserted between the carrier tape and the covering tape. The adjustment portion is configured to adjust a projection amount of the inserting portion from the pressing surface.

12 Claims, 25 Drawing Sheets

(51) Int. Cl.
*H05K 13/04* (2006.01)
*B32B 38/10* (2006.01)

(52) U.S. Cl.
CPC ........ *B32B 43/006* (2013.01); *Y10T 156/1184* (2015.01); *Y10T 156/1961* (2015.01)

(58) Field of Classification Search
CPC .............. Y10T 156/1967; H05K 13/02; H05K 13/0417; H05K 13/0419
USPC ........................................ 156/717, 761, 762
See application file for complete search history.

(56) References Cited

U.S. PATENT DOCUMENTS

| | | | | |
|---|---|---|---|---|
| 6,619,526 | B1* | 9/2003 | Souder, Jr. ............. | B65H 20/22 226/151 |
| 6,699,355 | B2* | 3/2004 | Yman .................... | H05K 13/02 156/701 |
| 6,948,541 | B2* | 9/2005 | Bergstrom ......... | H05K 13/0417 156/750 |
| 7,220,095 | B2* | 5/2007 | Lyndaker ........... | H05K 13/0419 414/810 |
| 7,850,040 | B2* | 12/2010 | Davis ................. | H05K 13/0419 221/72 |
| 7,930,819 | B2* | 4/2011 | Yonemitsu ......... | H05K 13/0417 226/76 |
| 8,353,424 | B2* | 1/2013 | Ikeda ................. | H05K 13/0419 221/25 |
| 8,678,065 | B2* | 3/2014 | Hwang .............. | H05K 13/0215 156/764 |
| 8,999,108 | B2* | 4/2015 | Nagao ................ | H05K 13/0417 156/714 |
| 9,414,536 | B2* | 8/2016 | Yamasaki .............. | H05K 13/02 |
| 9,578,793 | B2* | 2/2017 | Kitani .................... | H05K 13/02 |
| 9,674,995 | B2* | 6/2017 | Yanagida ............ | H05K 13/0419 |
| 9,736,970 | B2* | 8/2017 | Kanda ................ | H05K 13/0417 |
| 9,913,419 | B2* | 3/2018 | Ohashi ............... | H05K 13/0417 |
| 9,914,609 | B2* | 3/2018 | Ohashi .................. | B65H 20/22 |
| 10,321,619 | B2* | 6/2019 | Ohashi ............... | H05K 13/0419 |
| 2007/0241028 | A1* | 10/2007 | Larsson ............. | H05K 13/0419 206/714 |
| 2010/0239401 | A1* | 9/2010 | Kim ..................... | B65H 37/002 414/412 |
| 2010/0256819 | A1* | 10/2010 | Song ................. | H05K 13/0417 700/275 |
| 2014/0060749 | A1* | 3/2014 | Choi ................. | H05K 13/0417 156/719 |
| 2014/0367049 | A1* | 12/2014 | Higuchi ............... | B65H 37/002 156/719 |
| 2015/0212519 | A1* | 7/2015 | Sumi .................. | H05K 13/0417 700/115 |
| 2015/0382523 | A1* | 12/2015 | Hwang .............. | H05K 13/0417 414/412 |
| 2016/0212897 | A1* | 7/2016 | Tsuge ................. | H05K 13/0417 |
| 2018/0054929 | A1* | 2/2018 | Sugimoto ............. | H05K 13/02 |

FOREIGN PATENT DOCUMENTS

| | | |
|---|---|---|
| JP | 2014-072462 A | 4/2014 |
| JP | 2014-093334 A | 5/2014 |
| JP | 2015-103664 A | 6/2015 |

OTHER PUBLICATIONS

An Office Action mailed by the Japanese Patent Office dated Jan. 7, 2020, which corresponds to Japanese Patent Application No. 2018-507944 and is related to U.S. Appl. No. 16/085,915.

An Office Action mailed by the State Intellectual Property Office of the People's Republic of China dated Jan. 21, 2020, which corresponds to Chinese Patent Application No. 201680083436.9 and is related to U.S. Appl. No. 16/085,915.

An Office Action mailed by the Japanese Patent Office dated Oct. 17, 2019, which corresponds to Japanese Patent Application No. 2018-507944 and is related to U.S. Appl. No. 16/085,915; with English language translation.

* cited by examiner

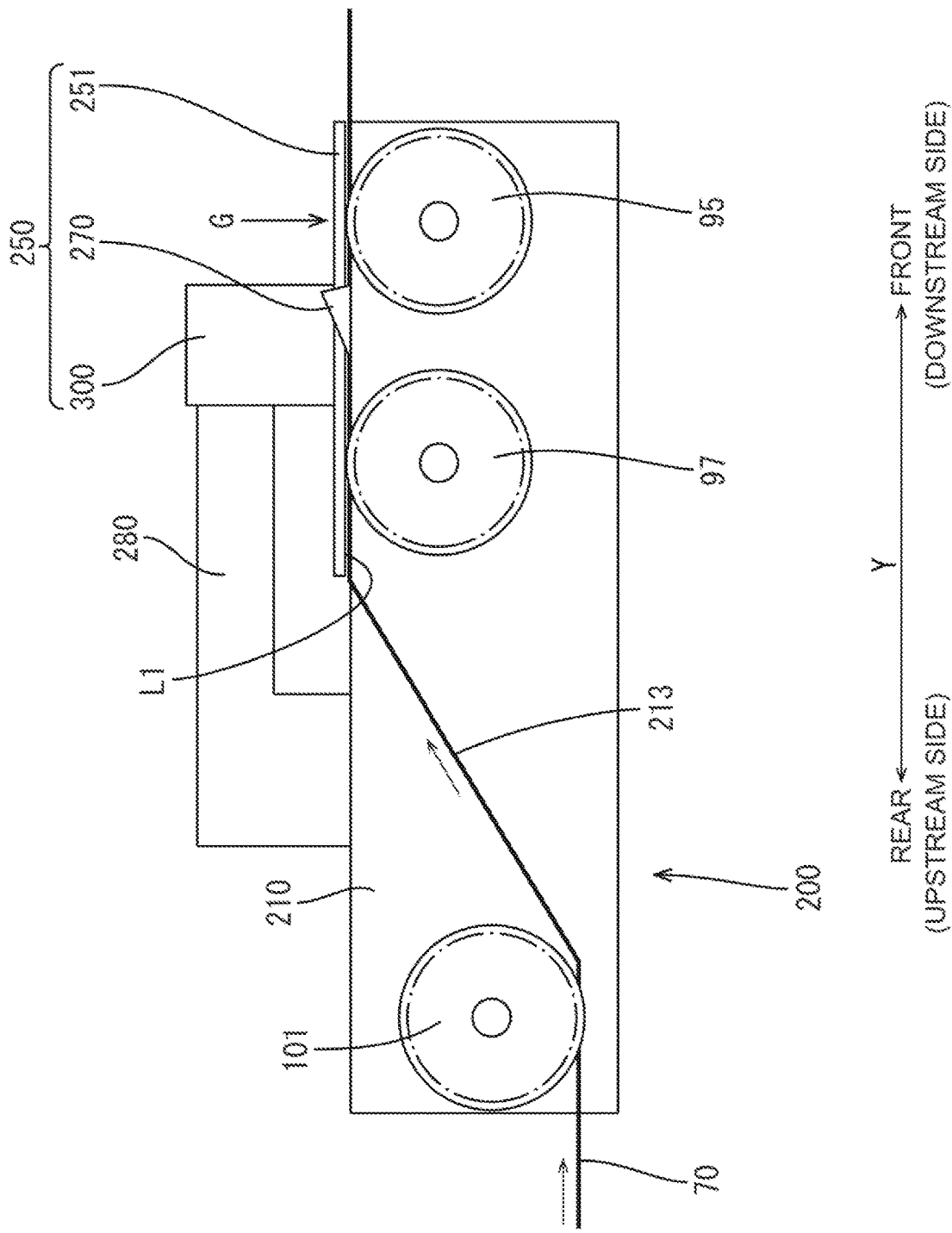

REAR (UPSTREAM SIDE) ← Y → FRONT (DOWNSTREAM SIDE)

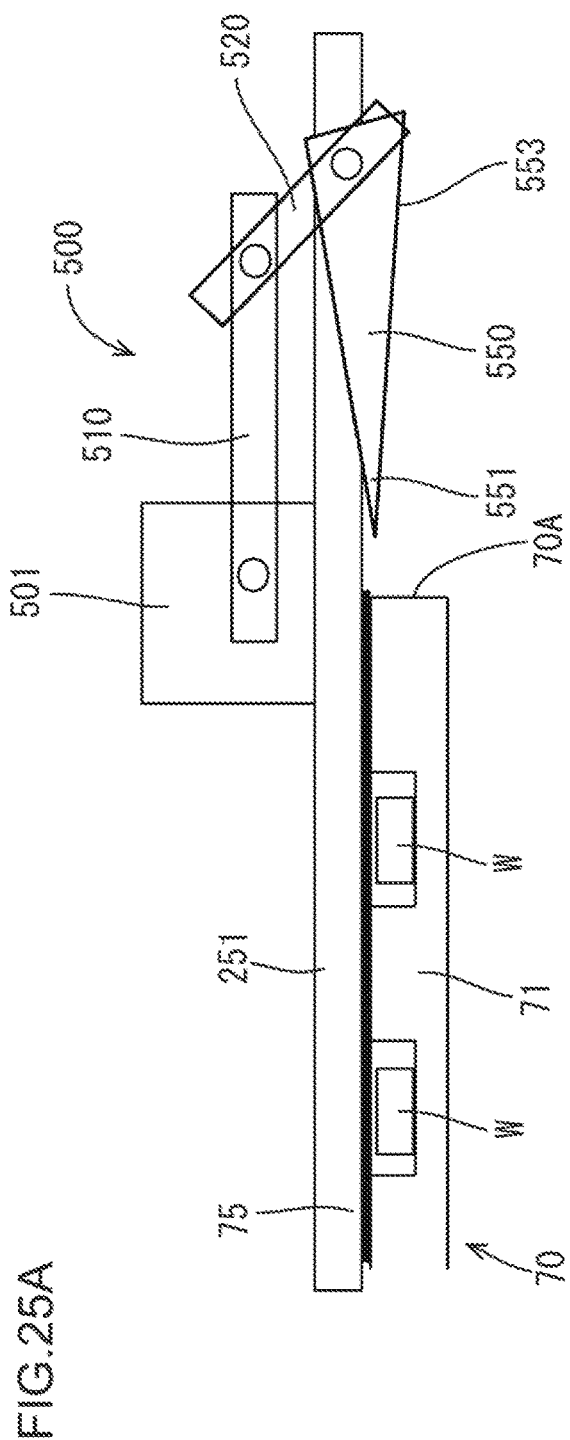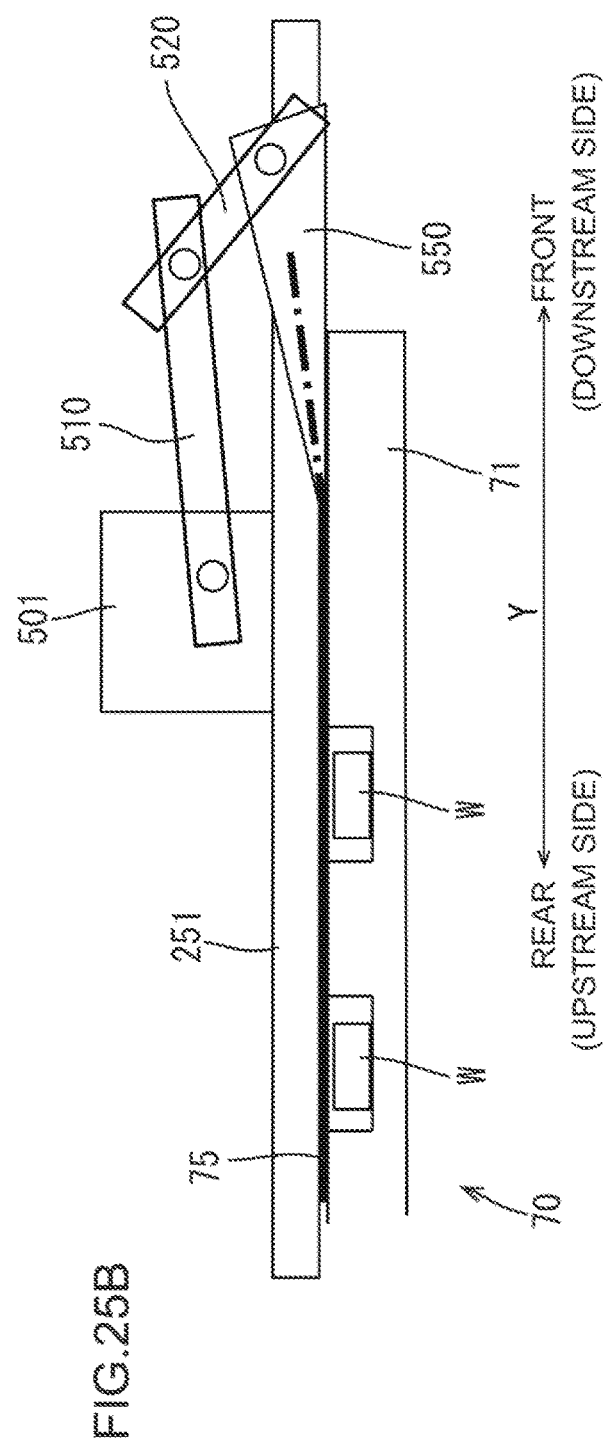

COMPONENTS FEEDER

CROSS-REFERENCE TO RELATED APPLICATION

This application is a National Stage of International Patent Application No. PCT/JP2016/060436, filed Mar. 30, 2016, the entire content of which is incorporated herein by reference.

BACKGROUND

Technical Field

The technology disclosed herein relates to a components feeder for feeding components to a surface mounter.

Background Art

A components feeder so-called a feeder has been known as a device installed in a surface mounter for feeding electronic components for mount. The feeder includes a components feeing tape that holds components at equal intervals. The feeding tape is pulled out of a reel to feed the components forward to a components feeing position. At the components feeding position, the components are extracted by mounting heads in the surface mounter.

The components feeding tape includes a carrier tape and a covering tape. The carrier tape includes component holding portions at equal intervals. The covering tape adheres to the carrier tape. To extract the components at the components feeding position, the components need to be exposed from the component holding portions. Japanese Patent Application Publication No. 2014-93334 discloses a configuration in which sections of a covering tape are cut by a cutter with a blade of the cutter inserted between the tapes to expose the components. Japanese Patent Application Publication No. 2015-103664 discloses a configuration in which sections of a covering tape are removed from a carrier tape with a blade of a cutter inserted between the tapes to expose components.

SUMMARY

When the components feeding tape is conveyed, the top surface of the components feeding tape is pressed by a tape guide. To insert the blade between the tapes, the blade needs to be projected from the pressed surface of the components feeding tape. However, the projected blade may contact the components in the component holding portions. Other than the blade, inserting any member between the tapes may cause the same type of problem.

The technology described herein was made in view of the foregoing circumstances. The technology reduces contact of components with an inserting member inserted between tapes such as a blade.

A component feeder described herein is for feeding components to a component feeding position using a component feeding tape including a carrier tape holding the components at equal intervals and a covering tape attached to an upper surface of the carrier tape. The component feeder includes a driving sprocket and a tape guide. The driving sprocket is configured to feed the component feeding tape to the component feeding position. The tape guide includes a guide body, a component exposing portion, and an adjustment portion. The guide body includes a pressing surface to press an upper surface of the component feeding tape fed to the component feeding position. The component exposing portion is configured to expose the components in the component feeding tape fed to the component feeding position. The component exposing portion includes an inserting portion to be inserted between the carrier tape and the covering tape. The adjustment portion is configured to adjust a projection amount of the inserting portion from the pressing surface.

In this configuration, the projection amount of the inserting portion from the pressing surface can be adjusted. Therefore, the inserting portion is less likely to contact the components although the inserting portion can be easily inserted between the tapes.

Preferable embodiments of the surface mounter described herein may include the following configurations.

The component feeder may further include a loading sprocket configured to feed a front edge of the component feeding tape to the driving sprocket. The adjustment portion may be configured to increase the projection amount of the inserting portion from the pressing surface during loading of the component feeding tape to the component feeding position to which the component feeding tape is not loaded and to reduce the projection amount of the inserting portion from the pressing surface after the loading. In this configuration, the inserting portion can be easily inserted between the tapes during the loading and is less likely to contact the components after the loading.

The tape guide may include the component exposing portion fixed to the guide body and a movable member movable relative to the guide body. The movable member may include a pressing surface to press an upper surface of the component feeding tape on an upstream side relative to the inserting portion of the component exposing portion and be configured to adjust a projection amount of the inserting portion from the pressing surface of the movable member by moving the movable member relative to the guide body. In this configuration, the component exposing portion is fixed to the guide body. Therefore, the inserting portion of the component exposing portion is precisely positioned relative to the component feeding tape. Because the movable member is movable, the position of the pressing surface varies. Therefore, the projection amount of the inserting portion can be adjusted.

The movable member may move in a direction to reduce the projection amount when pushed by the front edge of the component feeding tape that is moved toward the component feeding position. In this configuration, the movable member is moved using the movement of the component feeding tape. Therefore, an actuator (a power source) for moving the movable member is not required.

The movable member may be a rotary member that is rotatable about a rotation axis relative to the guide body. In this configuration, the movable member is the rotary member. In comparison to a sliding member, a malfunction is less likely to occur and the movable member can be provided in a compact size.

The component exposing portion may include a cutter blade including a blade tip to be inserted between the carrier tape and the covering tape. The cutter blade may be configured to cut the covering tape open to expose the components at the component feeding position. The rotary member may include a cover and two arms. The cover may be disposed on the upstream side relative to the rotation axis, cover a section of the cutter blade on the upstream side, and include a lower surface configured as a pressing surface to press the upper surface of the component feeding tape. The arms may be disposed on a downstream side relative to the rotation axis and cover sides of the cutter blade. The lower surface of the cover may lower when the front edge of the component feeding tape contact the arms and the rotary member rotates to reduce the projection amount of the cutter blade. In this configuration, the projection amount of the cutter blade can be reduced by lowering the lower surface of the cover using the rotation of the rotary member.

The rotation axis of the rotary member may be located on the downstream side relative to the blade tip and above the blade tip. In this configuration, the rotation axis of the rotary member is disposed in a space above the cutter blade.

According to the technology described herein, the inserting portion of the component exposing portion is less likely to contact the components.

BRIEF DESCRIPTION OF THE DRAWINGS

FIG. 22 is an elevated view of a feeder in a second embodiment;
FIGS. 25A and 25B are elevated views of an adjustment portion in a fourth embodiment;

DETAILED DESCRIPTION

First Embodiment

1. Overall Configuration of Surface Mounter

Figure 1:
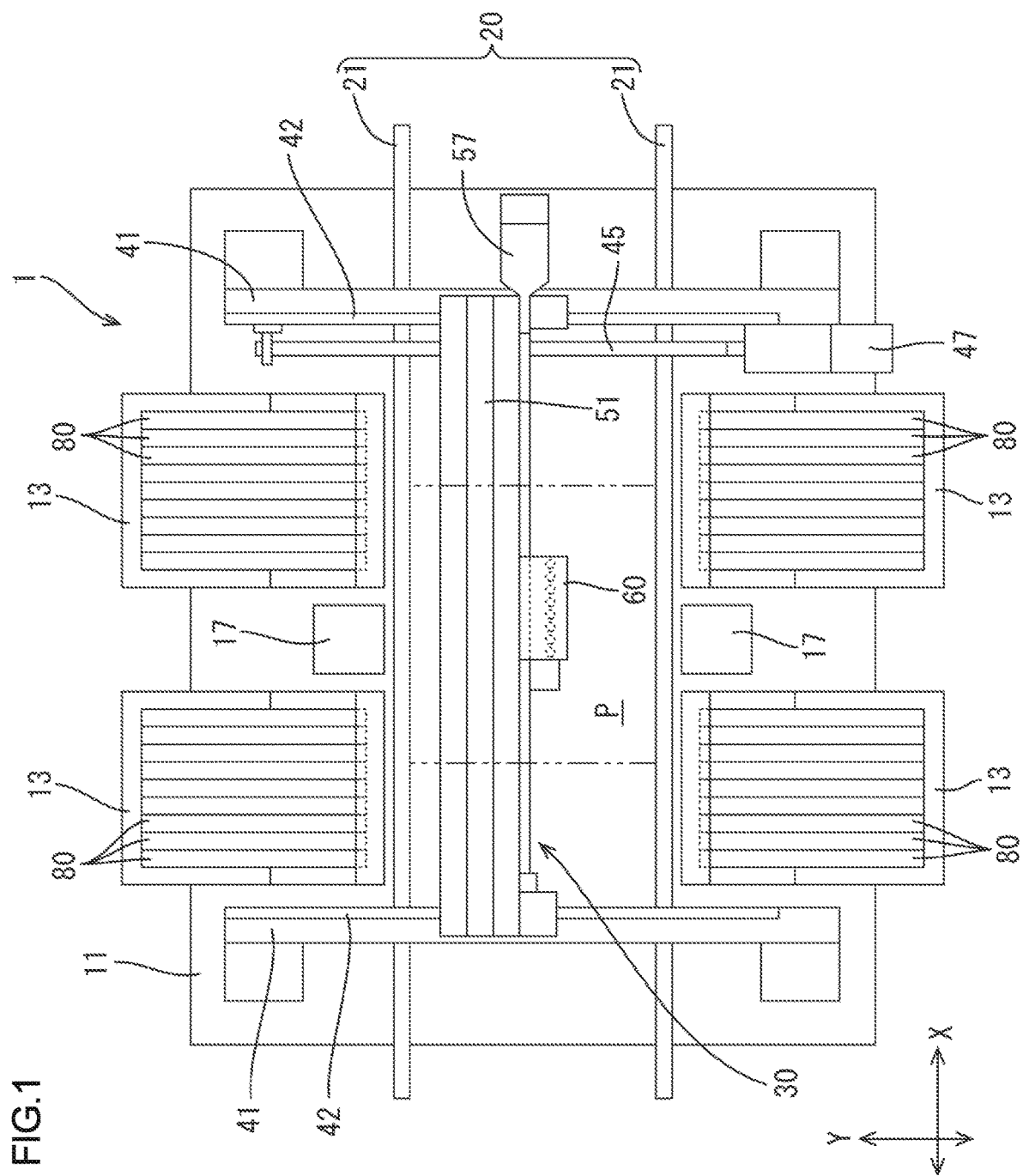
FIG. 1 is a plan view of a surface mounter according to a first embodiment.

As illustrated in FIG. 1, a surface mounter 1 includes a stage 11, a conveyer 20, a head unit 60, and a driving unit 30. The conveyer 20 transfers a print circuit board P. The driving unit 30 two-dimensionally moves the head unit 60 in a planar direction of the stage 11 (in the XY direction) above the stage 11. In the following paragraphs, a longitudinal direction of the stage 11 (the horizontal direction in FIG. 1), a depth direction of the stage 11 (the vertical direction in FIG. 1), and the vertical direction in FIG. 2 may be referred to as the X direction, the Y direction, and the Z direction, respectively.

The conveyer 20 is disposed at the center of the stage 11. The conveyer 20 includes a pair of conveyer belts 21 configured to turn in the X direction. The printed circuit board P indicated by two-dashed chain lines is held on the conveyer belts 21 with friction and transferred in the X direction.

The printed circuit board P enters the surface mounter 1 from the left side in FIG. 1. The printed circuit board P is carried from the left side in FIG. 1 to the inside of the surface mounter 1 by the conveyer 20. The printed circuit board P is carried to a work area at the center of the stage by the conveyer 20 and stopped there.

Four component feeding portions 13 are disposed to surround the work area on the stage 11. The component feeding portions 13 include feeders 80 that feed electronic components B. The feeders 80 are arranged in the horizontal direction in each component feeding portion 13.

In the work area, a mounting process for mounting the electronic component fed by the feeder 80 on the printed circuit board P with a mounting head 63 included in the head unit 60 is performed. After the mounting process is completed, the printed circuit board P is carried to the right side in FIG. 1 and to the outside of the surface mounter 1 by the conveyer 20.

The driving unit 30 includes at least a pair of supporting legs 41, a head support 51, a Y-axis ball screw 45, a Y-axis motor 47, an X-axis ball screw 55, and an X-axis motor 57. As illustrated in FIG. 1, the supporting legs 41 are disposed on the stage 11. The supporting legs 41 are located at edges of the work area and linearly extend in the Y direction.

Guide rails 42 that extend in the Y-axis direction are disposed on upper surfaces of the supporting legs 41, respectively. The head support 51 is fixed to the guide rails with ends of the head support 51 engaged with the guide rails 42, respectively.

The Y-axis ball screw 45 that extends in the Y direction is fixed to the supporting leg 41 on the right side and a ball nut (not illustrated) is screwed on the Y-axis ball screw 45. The Y-axis motor 47 is attached to the Y-axis ball screw 45.

When the Y-axis motor 47 is turned on, the ball nut moves backward along the Y-axis ball screw 45. As a result, the head support 51 fixed to the ball nut and the head unit 60, which will be described next, move in the Y direction along the guide rail 42 (Y-axis servo mechanism).

Figure 2:
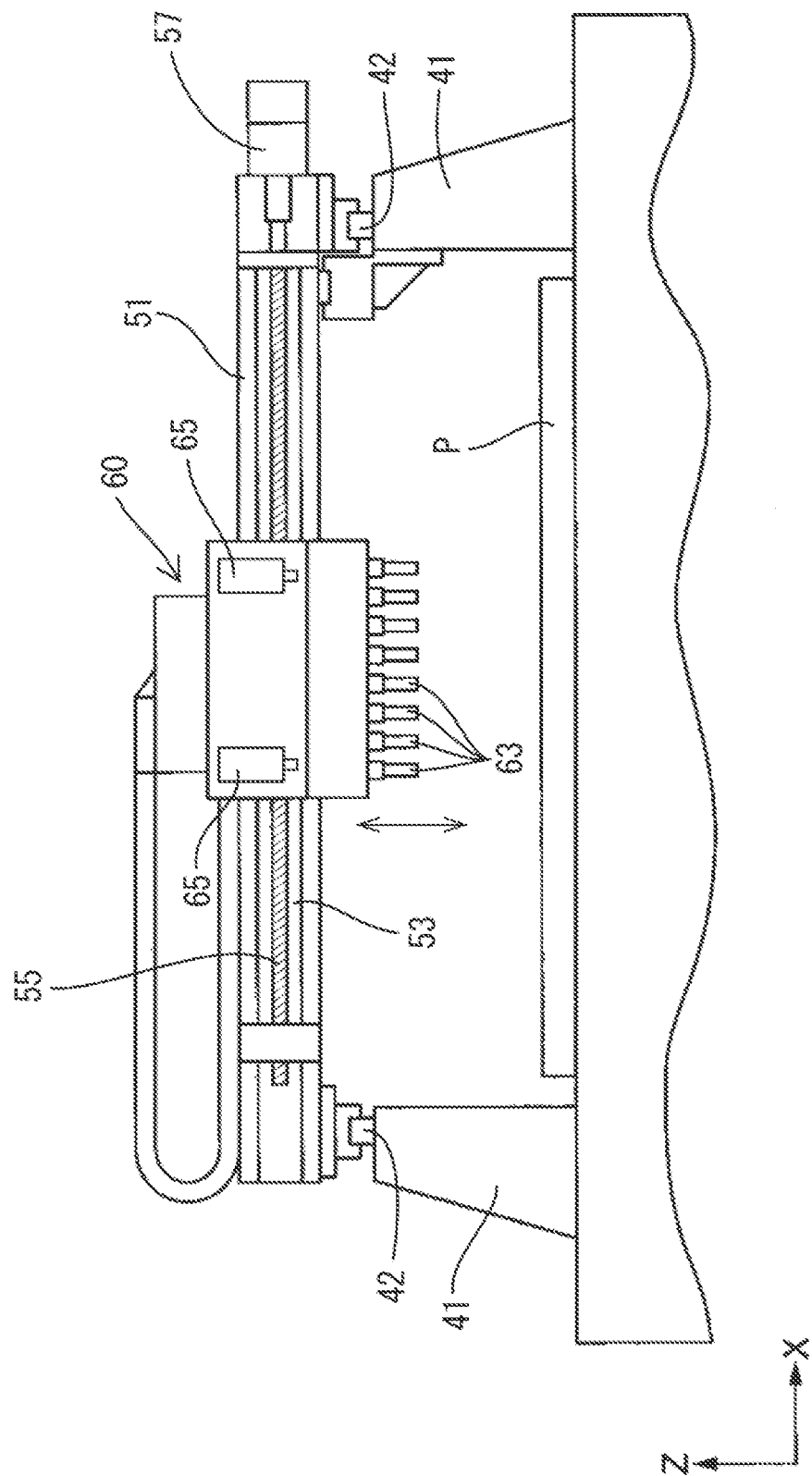
FIG. 2 is a view illustrating a supporting structure of a head unit.

The head support 51 has an elongated shape extending in the X direction. As illustrated in FIG. 2, a guide member 53 that extends in the X direction is disposed on the head support 51. The head unit 60 is attached to the guide member 53 to be movable along the axis of the guide member 53. The X-axis ball screw 55 that extends in the X direction is attached to the head support 51. A ball nut is screwed on the X-axis ball screw 55.

The X-axis motor 57 is attached to the X-axis ball screw 55. When the X-axis motor 57 is turned on, the ball nut moves backward along the X-axis ball screw 55. As a result, the head unit 60 fixed to the ball nut moves in the X direction along the guide member 53 (X-axis servo mechanism).

Through mutual control of the X-axis motor 57 and the Y-axis motor 47, two-dimensional movement of the head unit 60 on the stage 11 (in the XY direction) is possible.

The head unit 60 includes mounting heads 63 with which the electronic components are mounted. The mounting heads 63 are arranged in line. Each mounting head 63 is rotatable about an axis by an R-axis motor and movable up and down relative to the head unit 60 by the Z-axis motor. A negative pressure is applied to each mounting head 63 by a negative pressure application member, which is not illustrated. With the negative pressure, suction power is produced at a tip of the head.

By operating the X-axis motor 57, the Y-axis motor 47, and the Z-axis motor at predefined timing, each electronic component fed by the feeder 80 is extracted by the mounting head 63 and mounted on the printed circuit board P.

Reference sign "17" in FIG. 1 denotes component recognition cameras. Reference sign "65" in FIG. 2 denotes board recognition cameras. The component recognition cameras 17 are fixed to the stage 11 with imaging areas facing up.

The component recognition cameras 17 capture images of the electronic components that are vacuum-held by the mounting heads 63 and determine angles of the electronic components. The board recognition cameras 65 are fixed to the head unit 60 with imaging areas facing down. The board recognition cameras 65 move together with the head unit 60.

By driving the X-axis servo mechanism and the Y-axis servo mechanism, images of the printed circuit board at any positions on the printed circuit board P can be captured by the board recognition camera 65.

2. Configurations of a Component Feeding Tape 70 and the Feeder 80

Figure 3:
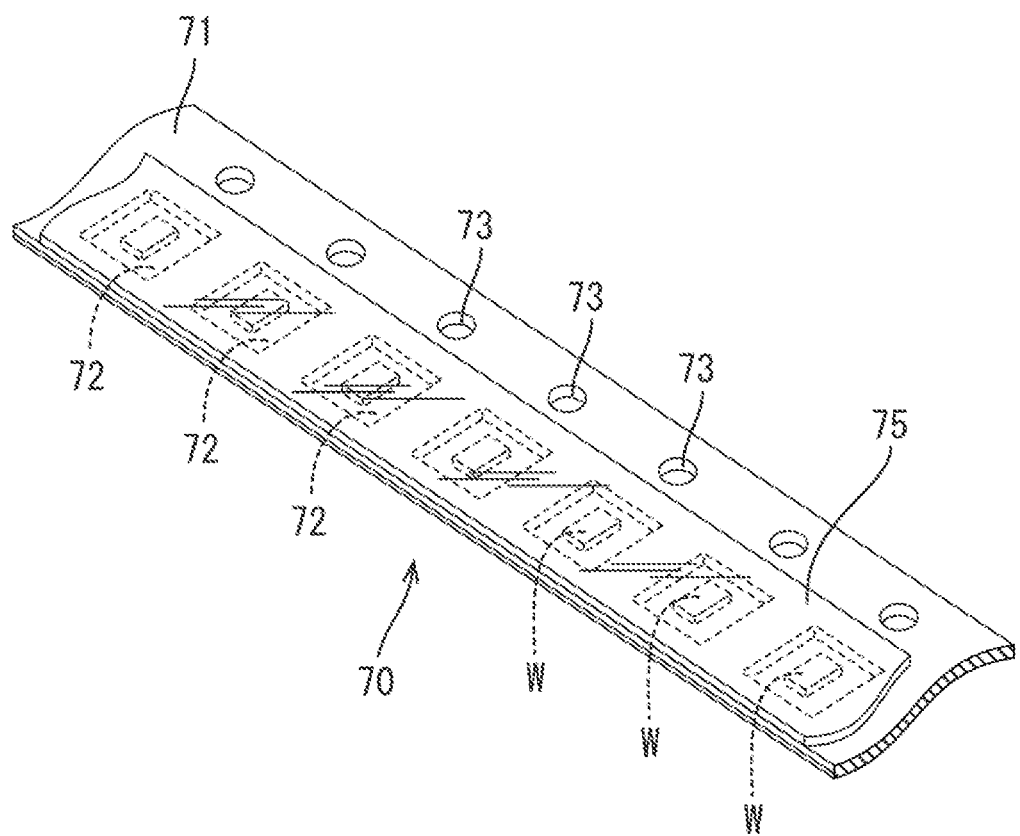
FIG. 3 is a perspective view of a component feeding tape.

As illustrated in FIG. 3, the component feeding tape 70 includes a carrier tape 71 and a covering tape 75 that adheres to the carrier tape 71. A material of the carrier tape 71 may be a synthetic resin. A material of the covering tape 75 may be a synthetic resin. The carrier tape 71 includes component holding portions 72 that are recesses with openings in the top surface of the carrier tape 71. The component holding portions 72 are arranged at equal intervals. Small-size electronic components W such as chip resistors are held in the component holding portions 72, respectively.

The covering tape 75 is a flexible thin sheet. Side edge sections of the tape adhere to the top surface of the carrier tape 71. The covering tape 75 covers the component holding portions 72 to restrict the electronic components W from popping out of the component holding portions 72. The carrier tape 71 includes locking holes in one of side sections at equal intervals along an edge. The component feeding tape 70 is wound on a reel that is located behind the feeder 80 but not illustrated.

Figure 4:
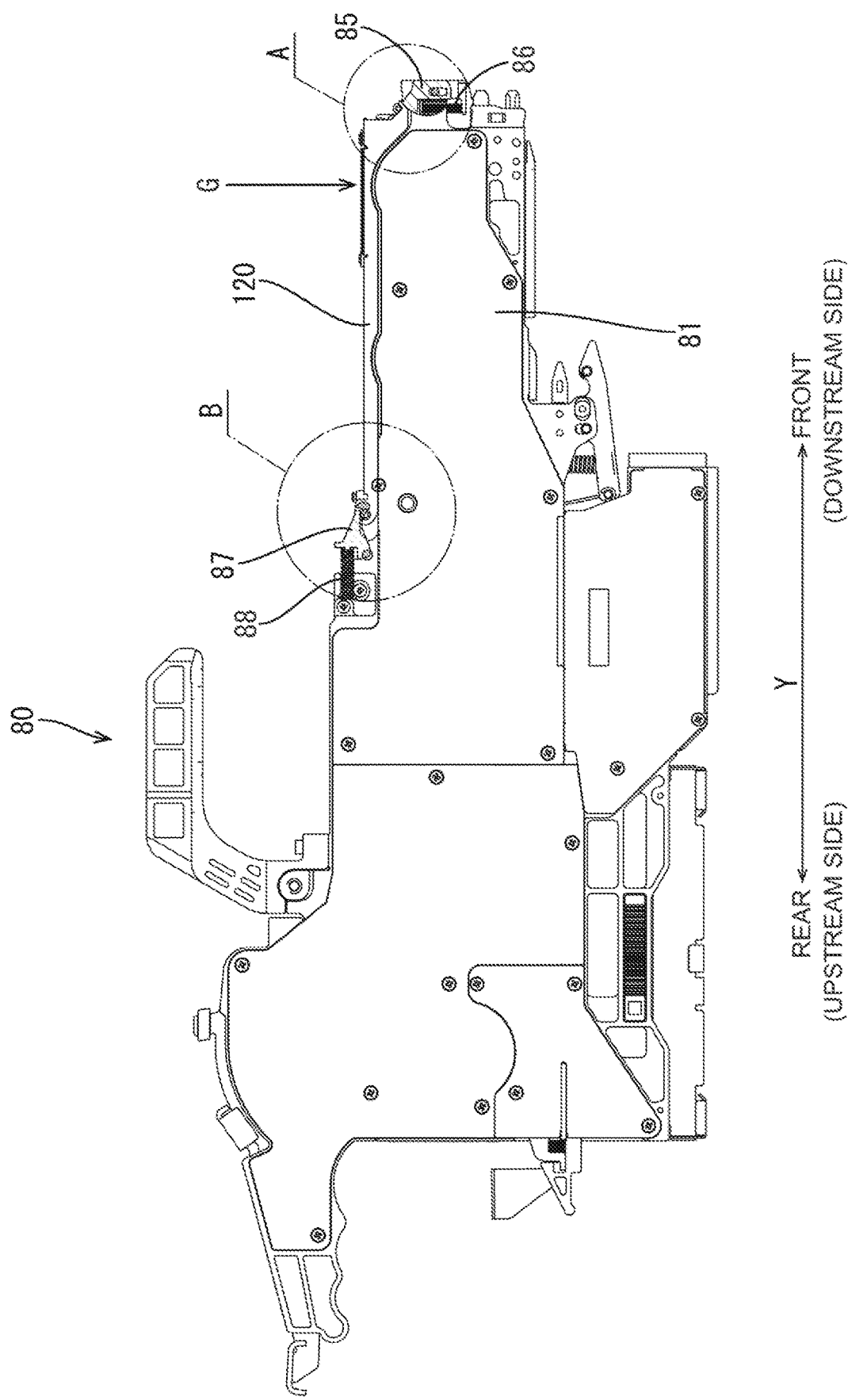
FIG. 4 is an elevated view of a feeder.
Figure 5:
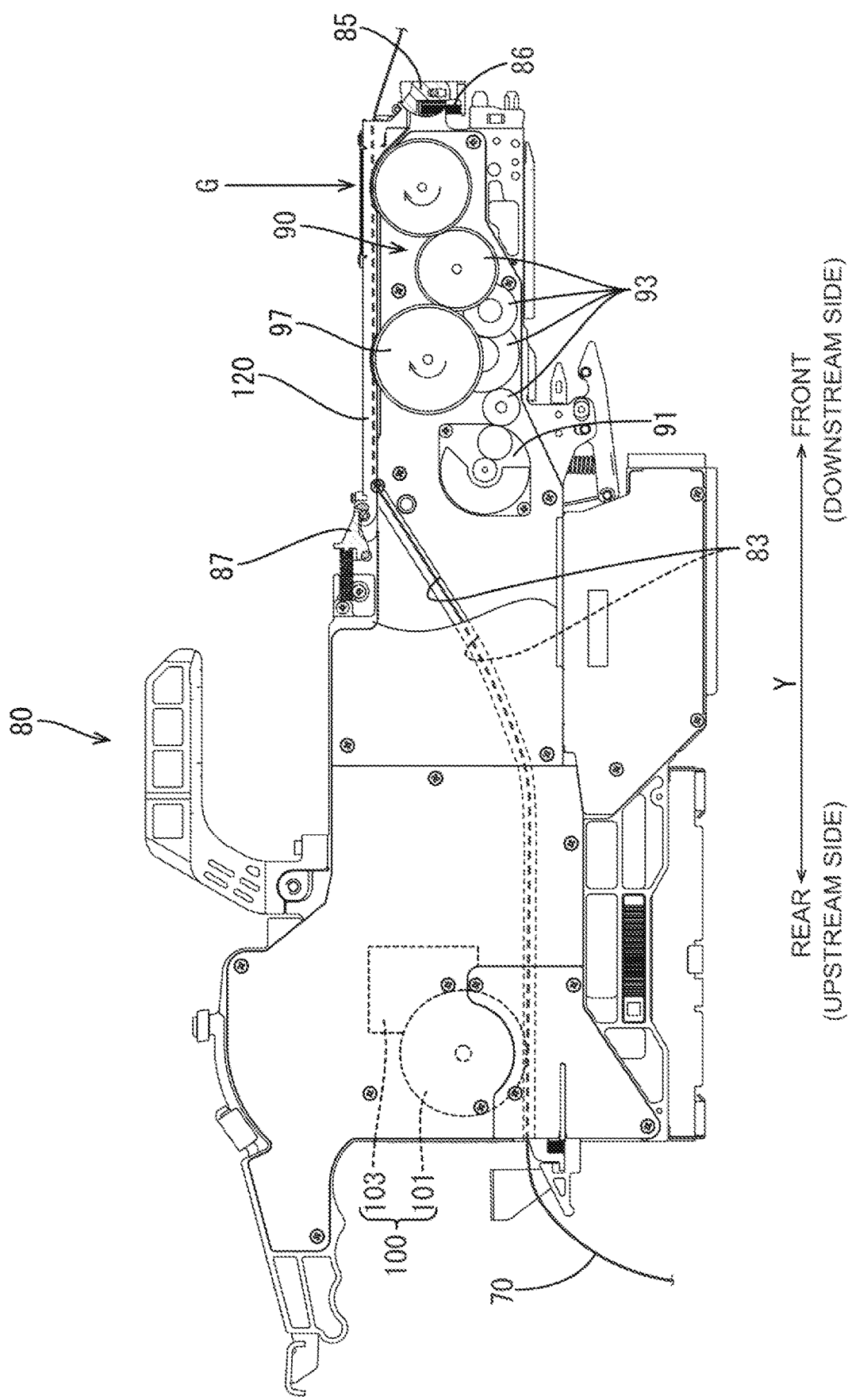
FIG. 5 is an elevated view of the feeder with a section cut out.
Figure 6:
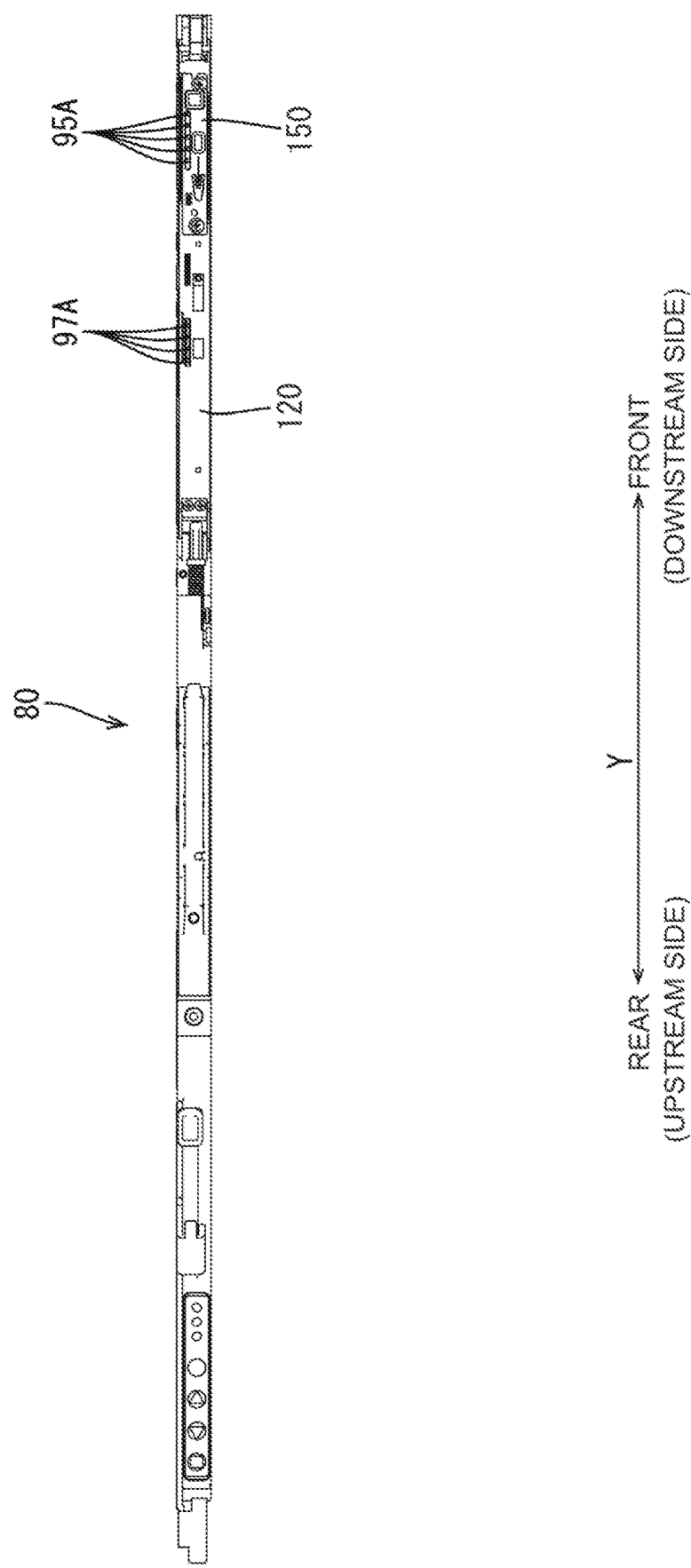
FIG. 6 is a plan view of the feeder.

As illustrated in FIGS. 4 and 5, the feeder 80 (an example of "a component feeder" of the claimed disclosure) includes a driving unit 90, an automatic loader 100, a tape guide 120, and a frame 81 to which the driving unit 90, the automatic loader 100, the tape guide 120 are attached.

The feeder 80 will be described. Regarding the description of the feeder 80, a side on which the component feeding position G is located (the right side in FIGS. 4 and 5) may be referred to as "the front side" and an opposite side from the component feeding position G (the left side in FIGS. 4 and 5) may be referred to as "the rear side." The component feeding tape 70 is fed from the rear side to the front side of the feeder 80 (from the left side to the right side in FIGS. 4 and 5). The rear side of the feeder 80 is "an upstream side" in a feeding direction of the component feeding tape 70 and the front side of the feeder 80 is "a downstream side in the feeding direction of the component feeding tape 70. The feeder 80 is perpendicular to the X direction that corresponds with the feeding direction of the printed circuit board P. Therefore, the front-rear direction of the feeder 80 corresponds with the Y direction as illustrated in FIGS. 4 and 5.

The frame 81 has an elongated shape that extends in the Y direction that corresponds with the front-rear direction. The frame 81 may be made of aluminum die-cast. The frame 81 includes a tape path 83 for passing the component feeding tape 70. The tape path 83 extends frontward from the lower rear end of the frame 81. The tape path 83 further extends obliquely upward and continues to the top surface of the frame 81.

As illustrated in FIG. 5, the driving unit 90 is disposed at the front of the frame 81. The driving unit 90 includes a motor 91, a line of gears 93, a first sprocket 95, and a second sprocket 97. The sprockets 95 and 97 are separated in the Y direction that corresponds with the front-rear direction on the upper portion of the frame 81. The line of gears 93 transfers power of the motor 91 to rotate the sprockets 95 and 97 in the same direction and with the same pitch.

The sprockets 95 and 97 include teeth 95A and 97A, respectively. The teeth 95A and 97A are formed at equal intervals at peripheries of the respective sprockets 95 and 97. The teeth 95A and 97A of the sprockets 95 and 97 are engaged in the locking holes 73 of the component feeding tape 70. With the rotation of the sprockets 95 and 97, the component feeding tape 70 is fed to a component feeding position G at the front of the feeder.

The first sprocket 95 is a main sprocket for driving to feed the component feeding tape 70 to the component feeding position G In this embodiment, the component feeding position G is located substantially at a top of the first sprocket 95. The second sprocket 97 is a sprocket for pushing to push the component feeding tape 70 fed from a third sprocket 101 in the automatic loader 100, which will be described next, to the first sprocket 95. The first sprocket 95 is an example of "a driving sprocket."

The automatic loader 100 has a function for attaching the component feeding tape 70 to an unattached feeder to which the component feeding tape 70 is not attached (a loading function). The automatic loader 100 is disposed at the rear of the frame 81. Loading means "a series of operation to insert the component feeding tape 70 into the feeder 80 and automatically loading the component feeding tape 70 to the component feeding position G."

The automatic loader 100 includes the third sprocket 101 and a motor 103 to drive the third sprocket 101. The third sprocket 101 is disposed above the tape path 83 at the rear of the frame 81. The third sprocket 101 includes teeth on the periphery of the third sprocket 101, similar to the first sprocket 95 and the second sprocket 97. The teeth are engaged in the locking holes 73 of the component feeding tape 70. By driving the motor 103 and rotating the third sprocket 101, the component feeding tape 70 is passed through the tape path 83 toward the front of the feeder and automatically loaded to the component feeding position G.

During loading, the sprockets 95, 97, and 101 rotate in synchronization with one another. The component feeding tape 70 fed by the third sprocket 101 is engaged with the teeth 97A of the second sprocket 97 and the teeth 95A of the first sprocket 95 when the front edge 70A of the tape passes the second sprocket 97 and the first sprocket 95.

Figure 7:
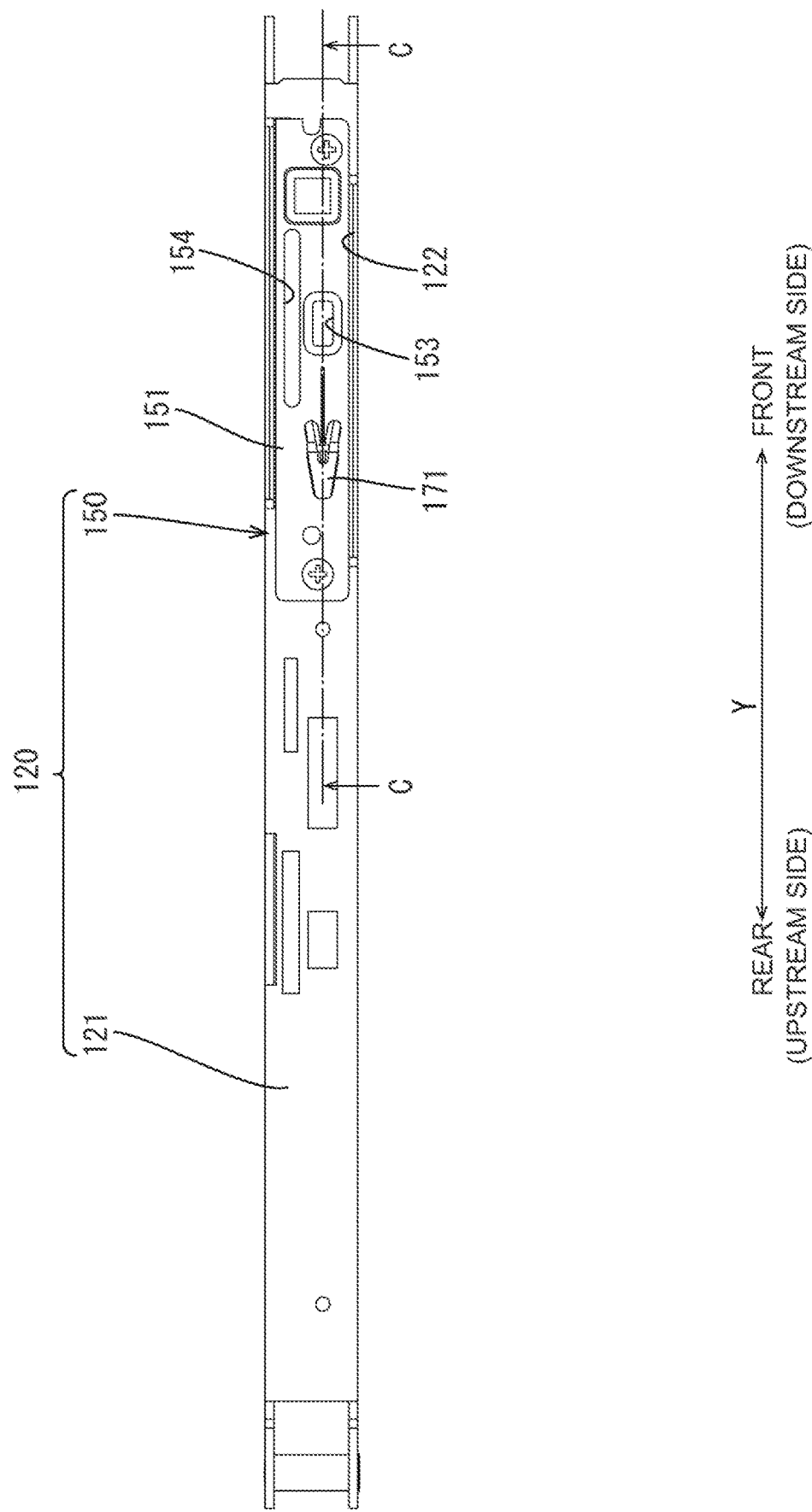
FIG. 7 is a plan view of a tape guide.

As illustrated in FIG. 7, the tape guide 120 includes a guide body 121 and an exposing unit 150 attached to the guide body 121. The guide body 121 may be made of metal. The guide body 121 has an elongated shape that extends in the Y direction that corresponds with the front-rear direction. As illustrated in FIG. 7, the guide body 121 has a length that substantially corresponds to an area of the feeder 80 in which the driving unit 90 is disposed. The guide body 121 is disposed on a front section of the top surface of the frame 81.

The frame 81 includes a front lock portion 85 and a rear lock portion 87 at positions corresponding to the front end and the rear end of the guide body 121. The front end and the rear end of the tape guide 120 are locked by the lock portions 85 and 87, respectively, and attached to the frame 81.

Figure 8:
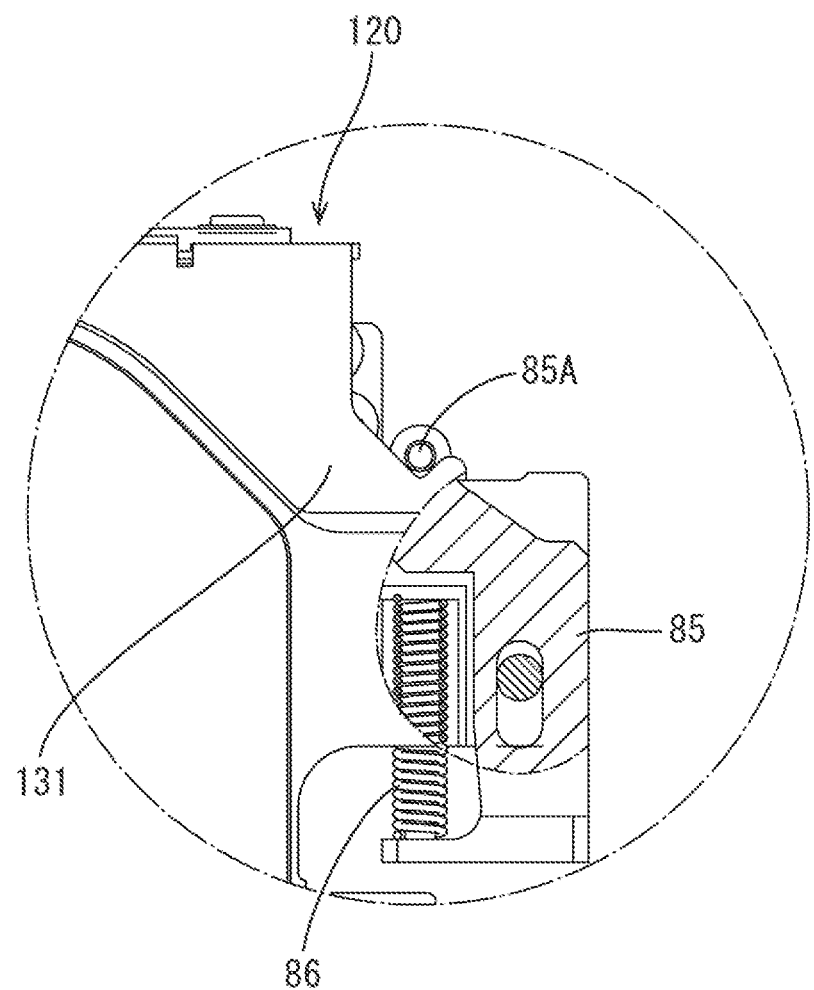
FIG. 8 is a magnified view of portion A in FIG. 4.

Specifically, as illustrated in FIG. 8, the front lock portion 85 is held at the front end of the frame 81 to be movable in the vertical direction. The front lock portion 85 includes a lock pin 85A that is engaged with a lock tab 131 of the front end portion of the guide body 121. The front lock portion 85 is biased downward with a spring 86. With the lock pin 85A pressing the lock tap 131, the front portion of the guide body 121 is locked.

The rear lock portion 87 is held to the upper portion of the frame 81 behind the guide body 121 with a hinge H2 to be rotatable. The rear lock portion 87 includes a lock piece 87A corresponding to an axial pin 133 disposed at the rear end of the guide body 121. The rear lock portion 87 is biased in a locking direction with a spring 88. With the lock piece 87A pressing the axial pin from above, the rear portion of the guide body 121 is locked.

Figure 9:
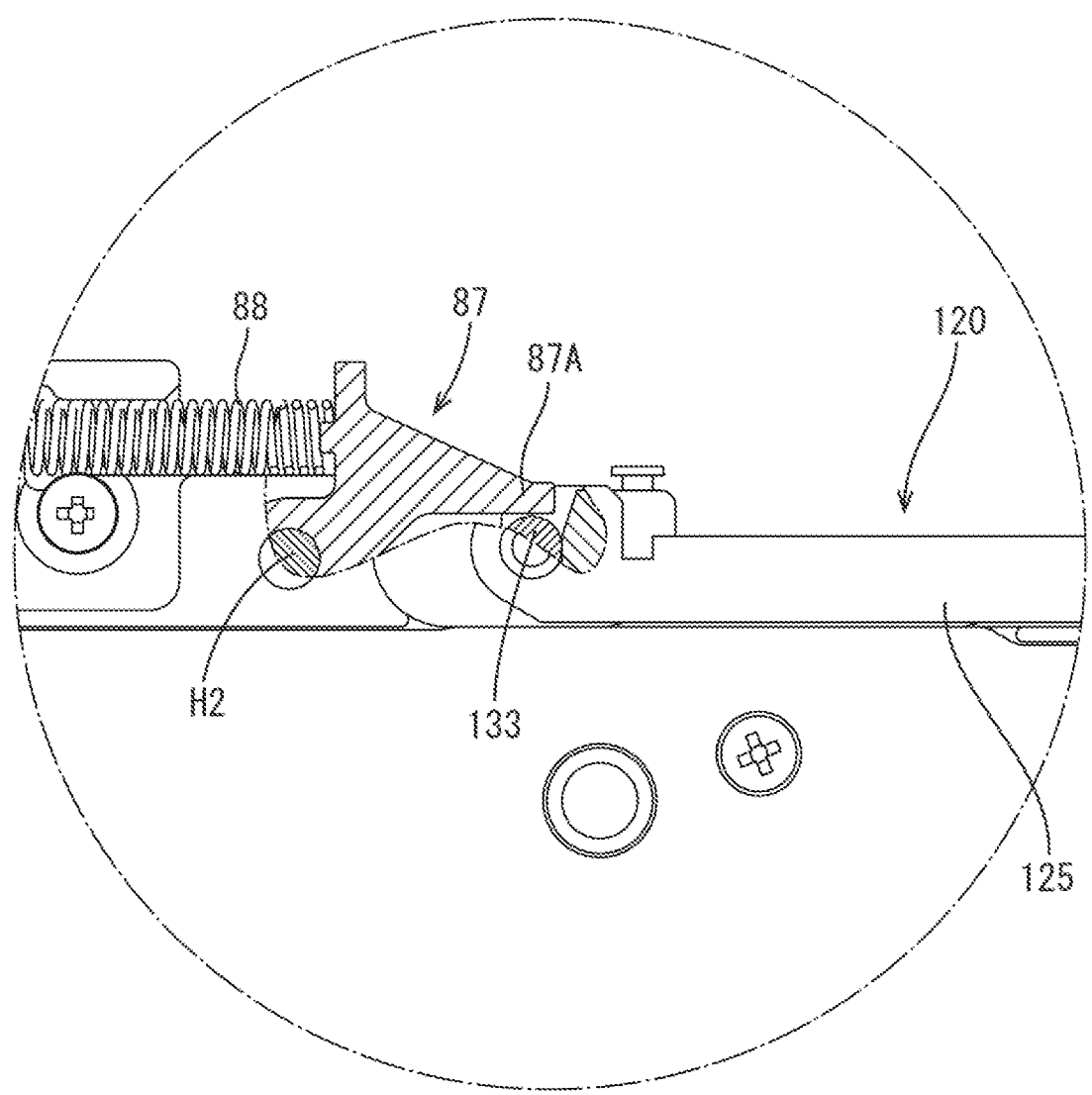
FIG. 9 is a magnified view of portion B in FIG. 4.

As described above, the front lock portion 85 and the rear lock portion 87 are configured to lock the tape guide 120 using elastic forces of the springs 86 and 88. When counter forces to biasing forces of the springs 86 are applied, the guide body 121 moves in the vertical direction. In FIG. 8, reference sign 127 denotes a lock pin that locks the rear lock portion 87. In FIG. 9, reference sign 128 denotes a lock tab that locks the front lock portion 85.

The guide body 121 has a function to maintain engagement between the teeth 95A and 97A of the sprockets 95 and 97 and the locking holes 73 of the component feeding tape 70 by pressing the component feeding tape 70 that is passed on the upper surface of the frame toward the component feeding position G to restrict uplift of the tape.

The guide body 121 includes a pair of guide walls 125 to guide sides of the component feeding tape 70. The guide walls 125 restrict tilting of the component feeding tape 70 on the upper surface 82 of the frame 81.

The exposing unit 150 is provided for exposing the components at the component feeding position G The exposing unit 150 includes a supporting member 151 having a plate shape, a cutter blade 161, and a rotary member 171. The supporting member 151 supports the cutter blade 161 and the rotary member 171. The cutter blade 161 is fixed to a lower portion of the supporting member 151 with a blade surface facing up. The rotary member is an example of "an adjustment portion, a movable member" of the claimed disclosure. The cutter blade 161 is an example of "a component exposing portion" of the claimed disclosure. A blade tip 163 is an example of "an inserting portion" of the claimed disclosure.

As illustrated in FIG. 7, the front portion of the guide body 121 includes a hole 122. The exposing unit 150 is attached to the tape guide 120 with the cutter blade 161 and the rotary member 171 in the hole 122 and the supporting member 151 screwed to a peripheral edge of the hole 122. The supporting member 151 includes a component ejection hole 153 for ejecting the electronic components W and an escape hole 154 for releasing the first sprocket 95.

Figure 10:
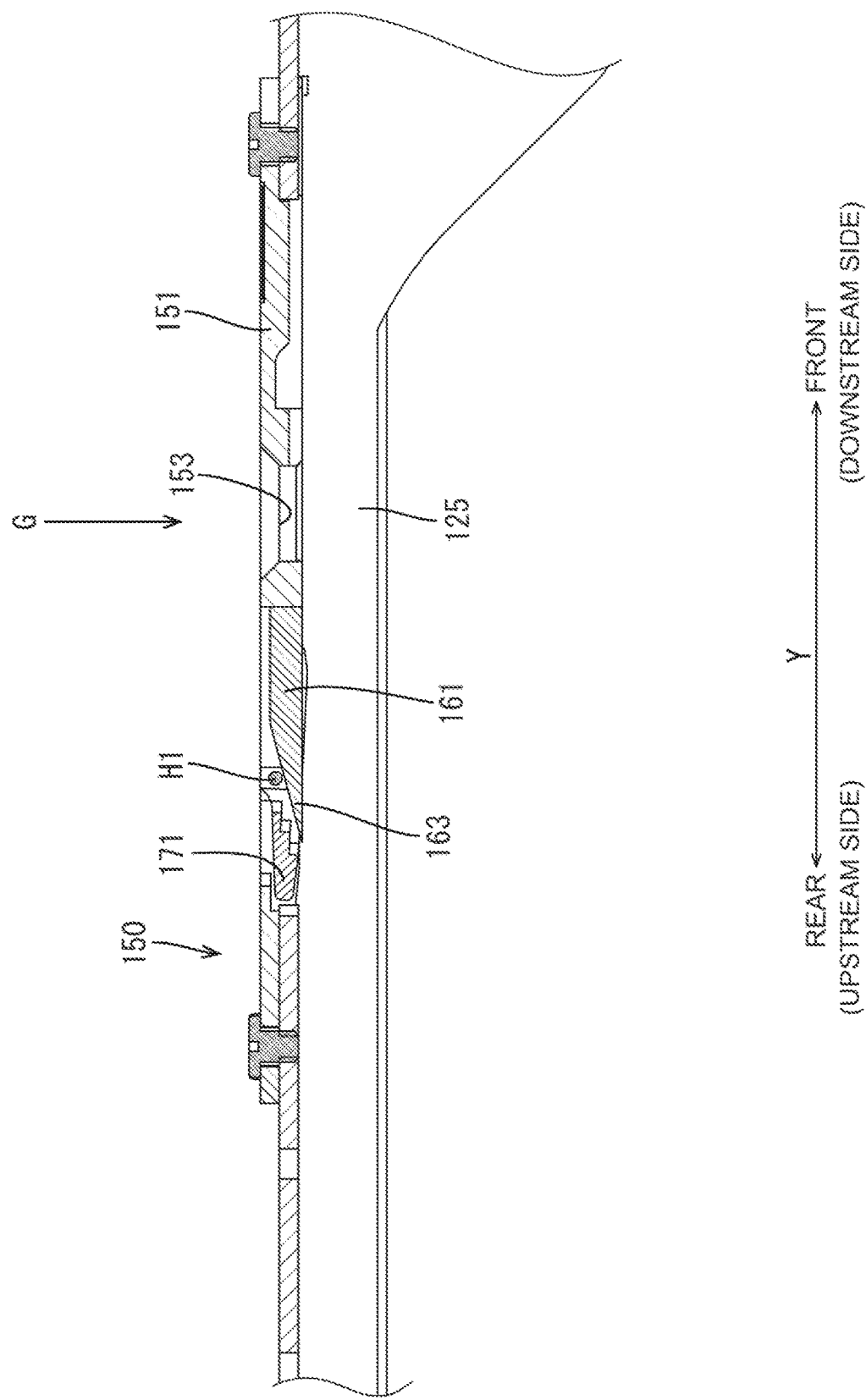
FIG. 10 is a cross-sectional view along line C-C in FIG. 7.
Figure 11:
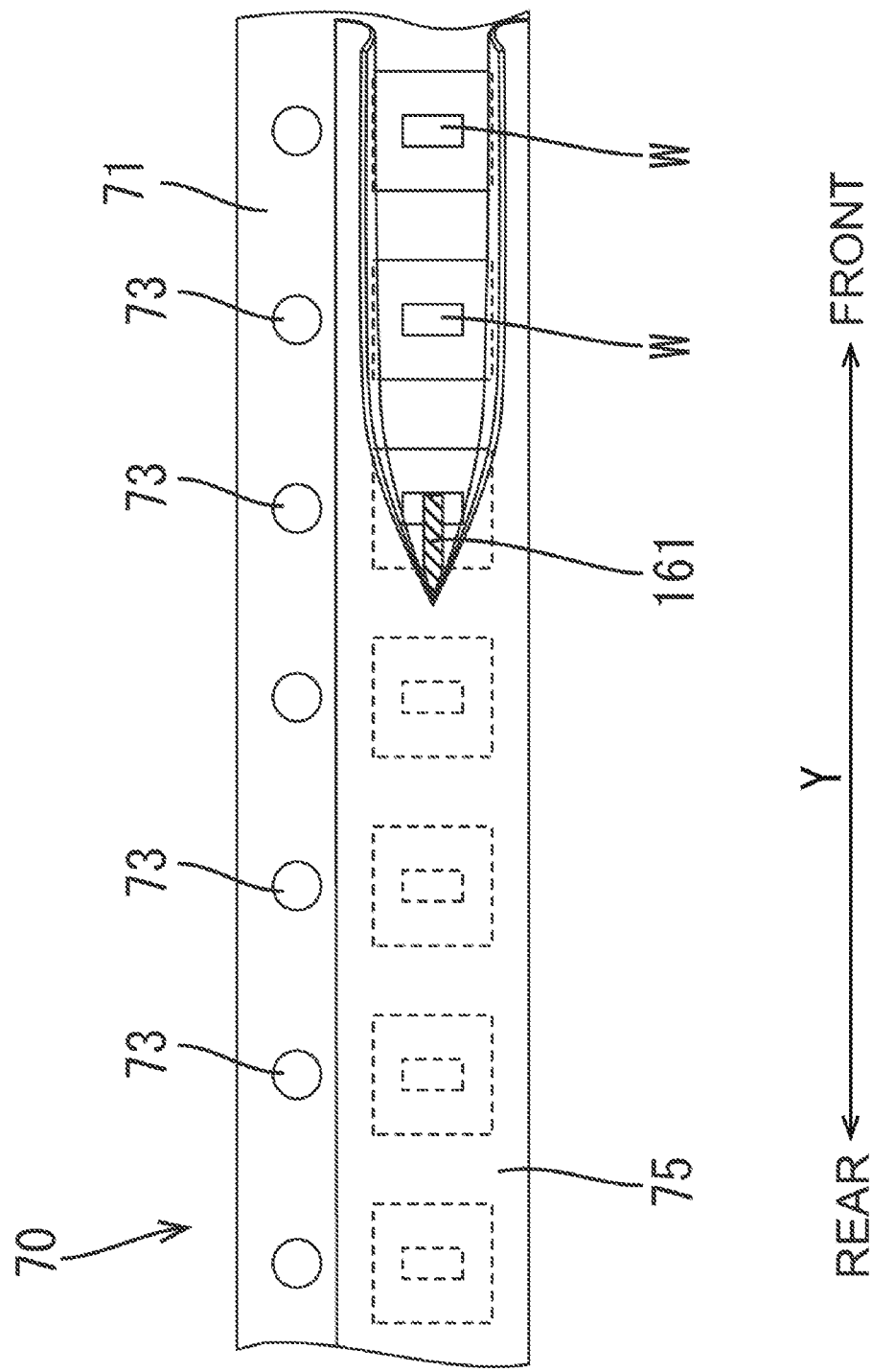
FIG. 11 is a plan view of a component feeding tape that is cut open.

As illustrated in FIGS. 10 and 11, the cutter blade 161 is located at an upstream side in the feeding direction of the component feeding tape 70 (the Y direction) The cutter blade 161 has a function for cutting the center of the covering tape 75 that is fed toward the component feeding position G.

As illustrated in FIG. 11, the covering tape 75, the center of which is cut, is open toward sides in the width direction thereof during passing sides of the cutter blade 161. As a result, the electronic components W in the component holding portions 72 are exposed.

In the supporting member 151 of the exposing unit 150, the component ejection hole 153 is provided at a position corresponding to the component feeding position G The mounting head 63 is moved to the component feeding position G at the same timing when the electronic component W is moved to the component feeding position G and the electronic component W is vacuum-held. The electronic component W is picked up from the component holding portion 72 through the component ejection hole 153.

Figure 17:
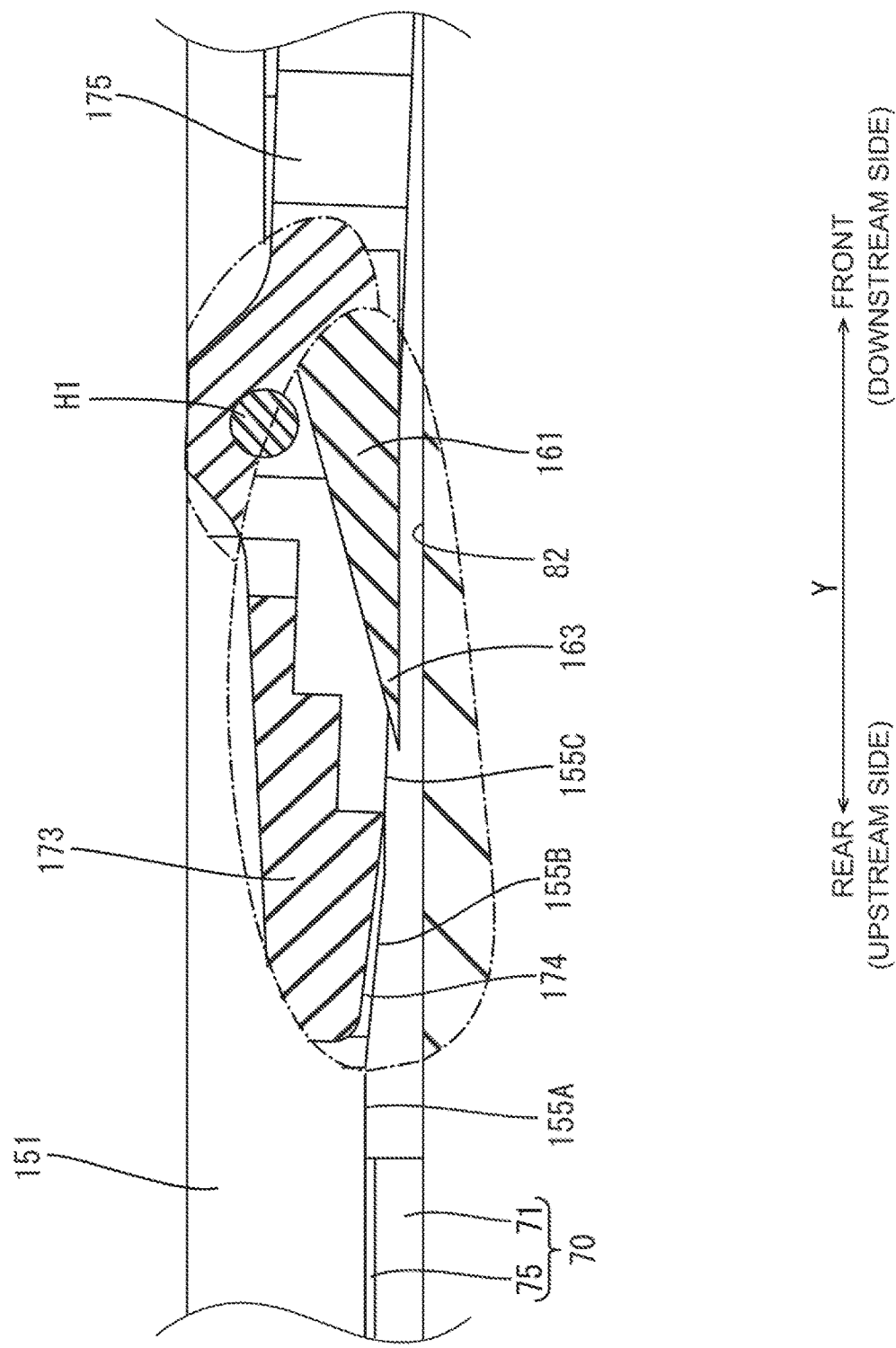
FIG. 17 is a magnified view of a portion of FIG. 16.

As illustrated in FIG. 17, the lower surface 155 of the supporting member 151 of the exposing unit 150 includes an uneven portion at the cutter blade 161 on the upstream side. The lower surface 155 includes a first horizontal portion 155A, a sloped portion 155B, and a second horizontal portion 155C. The first horizontal portion 155A, the sloped portion 155B, and the second horizontal portion 155C form a pressing surface for pressing the upper surface of the component feeding tape 70.

2. Adjustment Function for Adjusting a Projection Amount of the Cutter Blade 161

As illustrated in FIG. 10, the cutter blade 161 faces upward with the blade tip 163 facing the upstream side. With the blade tip 163 inserted between the carrier tape 71 and the covering tape 75, the component feeding tape 70 is fed to pass the cutter blade 161 and the cutter blade 161 cuts the covering tape 75. The insertion of the blade tip 163 between the tapes is performed when the front edge 70A of the component feeding tape 70 passes the cutter blade 171, that is, during loading.

When the front edge 70A of the component feeding tape 70 passes the cutter blade 171, it is preferable that the blade tip 163 of the cutter blade 161 projects downward from the pressing surface of the component feeding tape 70 during loading so that the blade tip 163 easily enters between the tapes.

However, if the blade tip 163 of the cutter blade 161 normally projects from the pressing surface, the blade tip 163 of the cutter blade 161 may contact the electronic component W during normal operation in which the component feeding tape 70 is fed with a predetermined pitch after the loading.

Therefore, in this embodiment, a projection amount of the cutter blade 161 from the pressing surface of the component feeding tape 70 is adjusted so that the cutter blade 161 is less likely to contact the electronic component W during the normal operation in which the component feeding tape 70 is fed with the predetermined pitch.

Figure 15:
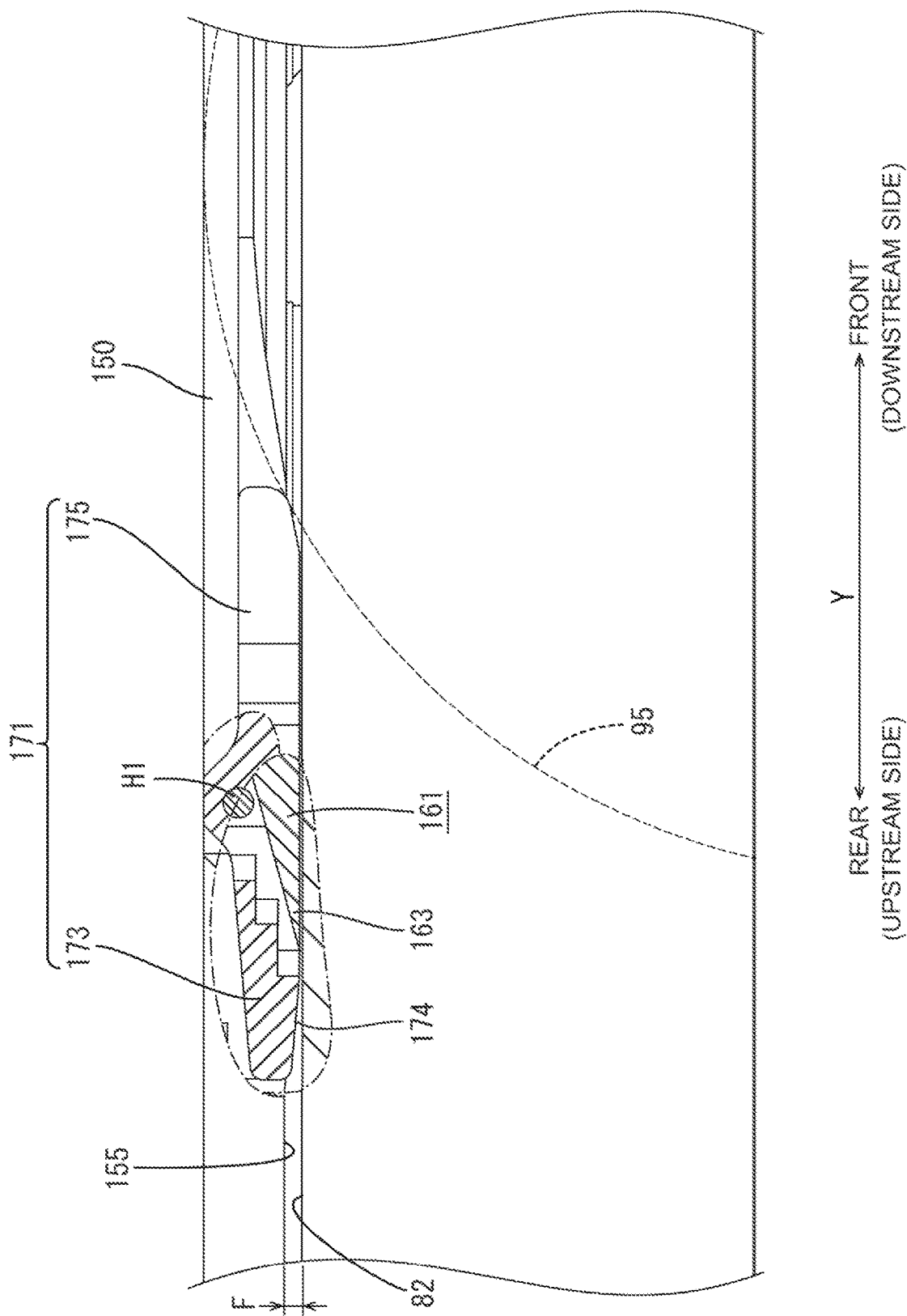
FIG. 15 is an elevated view of the upper portion of the feeder with a cross-sectional view in part.

Specifically, the exposing unit 150 includes the rotary member 171 in addition to the supporting member 151 and the cutter blade 161. As illustrated in FIG. 15, the rotary member 171 includes a cover 173 and a pair of arms 175. The cover 173 is located on the upstream side relative to the cutter blade 161 (the upstream side in the tape feeding direction, the left side in FIG. 15). The cover 173 covers the front side of the cutter blade 161 (on the upstream side).

Figure 12:
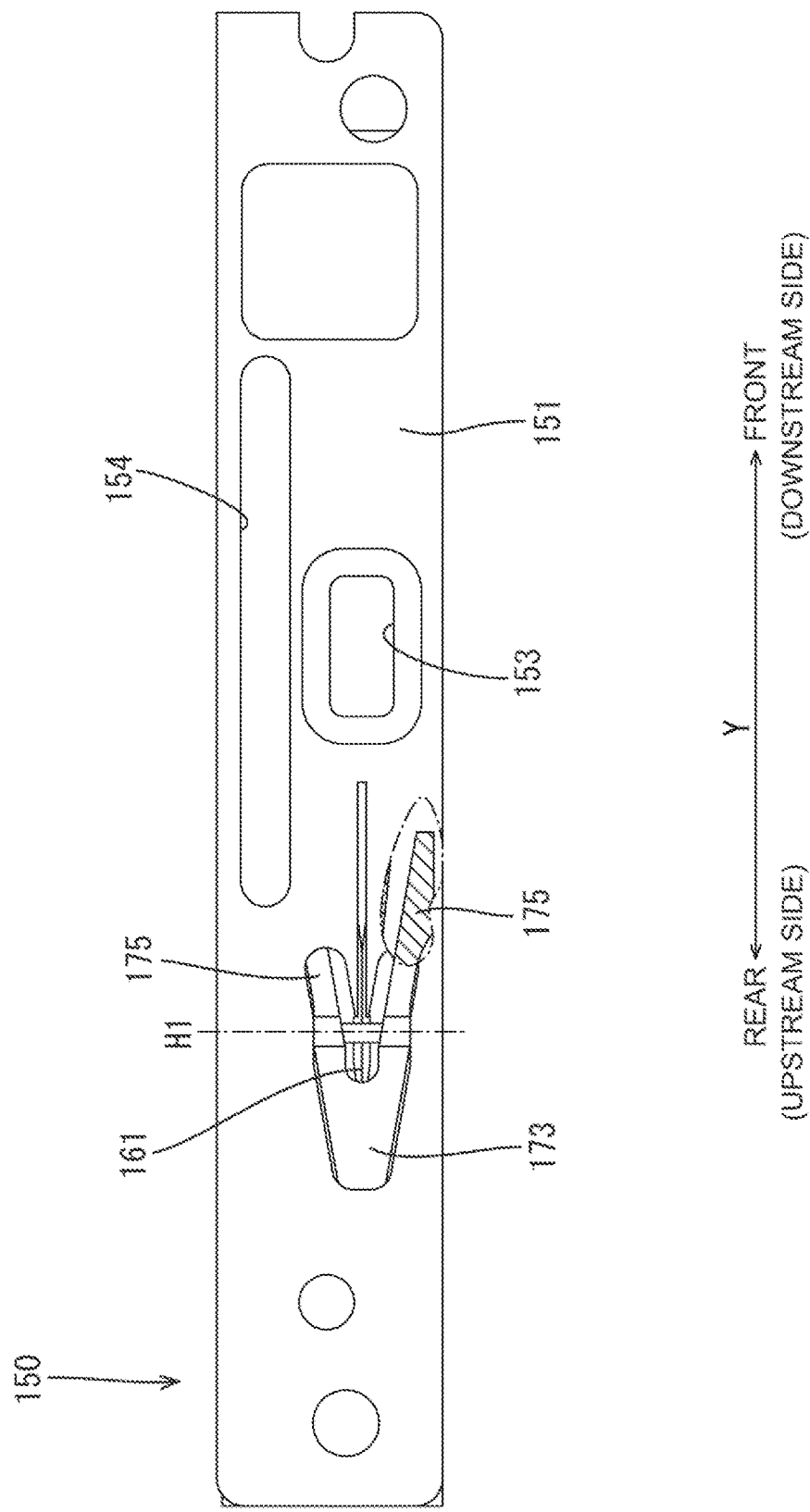
FIG. 12 is a plan view of a component exposed section.
Figure 13:
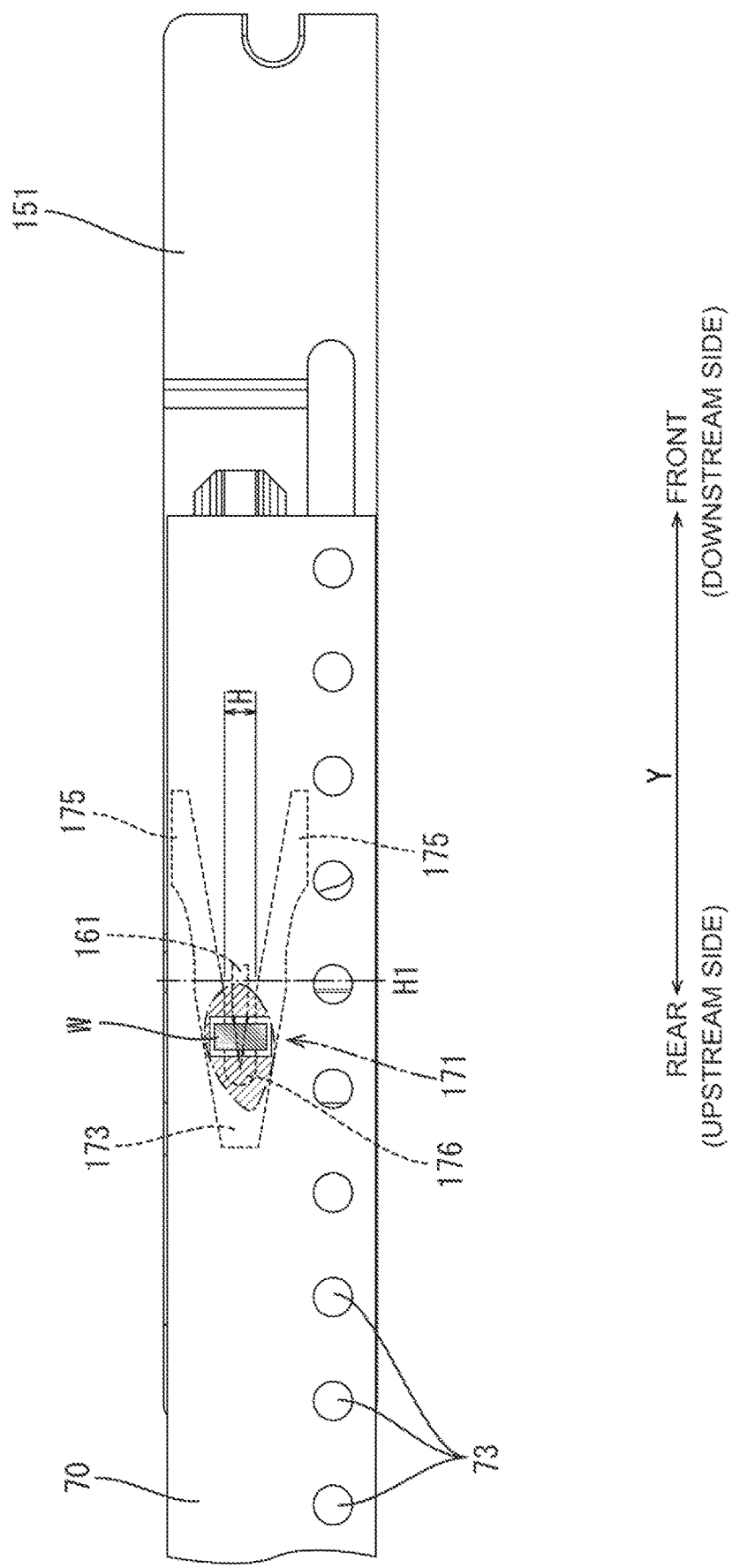
FIG. 13 is a view of the component exposed section viewed from the back of the component feeding tape.

As illustrated in FIGS. 12 and 13, the arms 175 branch off from the cover 173. The arms 175 extend toward the downstream side in the feeding direction of the component feeding tape 70. The arms 175 are located on sides of the cutter blade 161 to cover the sides of the cutter blade 161.

As illustrated in FIG. 13, the rotary member 171 has a substantially V shape. When viewed from the upper surface side, the cutter blade 161 is located inside the rotary member 171.

The rotary member 171 is coupled with the supporting member 151 via a hinge H1 and rotatable about the hinge H1. The hinge H1 is located substantially in the middle between the cover 173 and the arms 175. The cover 173 is located on the upstream side relative to the hinge H1 (the upstream side in the tape feeding direction, the left side in FIG. 15). The arms 175 are located on the downstream side relative to the hinge H1 (the downstream side in the tape feeding direction, the right side in FIG. 15).

When the rotary member 171 rotates clockwise, the cover 173 is lifted. When the rotary member 171 rotates counterclockwise, the arms 175 are lifted. The hinge H1 is located on the downstream side relative to the blade tip 163 (the downstream side in the tape feeding direction, the right side in FIG. 15) and above the blade tip 163.

In this embodiment, the rotary member 171 rotates when pushed by the front edge 70A of the component feeding tape 70. The projection amount of the blade tip 163 of the cutter blade 161 is reduced to restrict the contact of the cutter blade 161 with the electronic component W.

The operation of the adjustment will be described.

(A) When the tape is not inserted.

Figure 14:
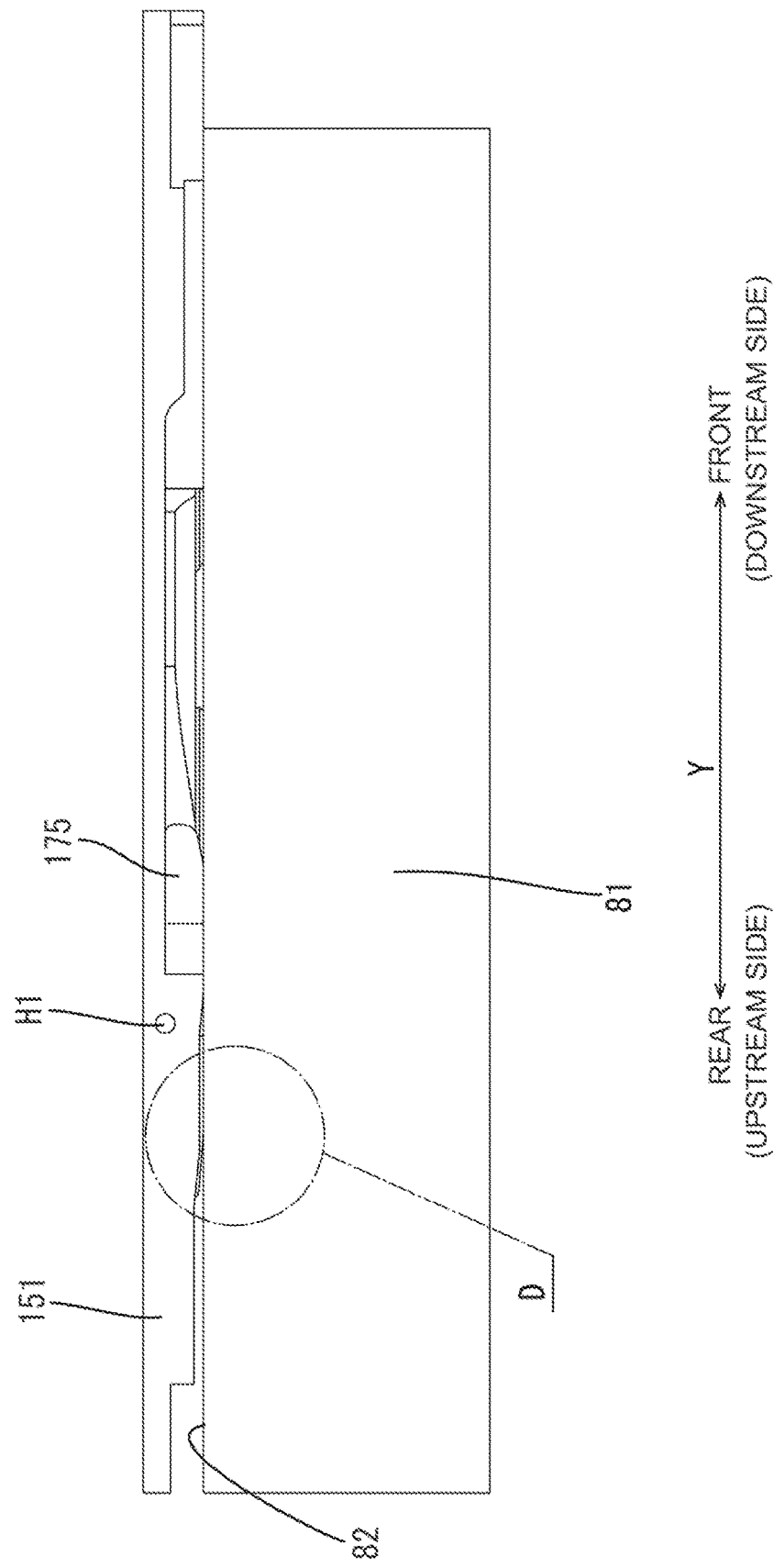
FIG. 14 is an elevated view of an upper portion of the feeder.

FIG. 14 is an elevated view of the upper portion of the feeder 80. FIG. 15 is an elevated view of the upper portion of the feeder 80 including a cross-section of a portion. FIG. 15 illustrates a state before the component feeding tape 70 is inserted in the feeder 80.

As illustrated in FIG. 15, before the component feeding tape 70 is inserted in the feeder 80, a predefined space F is provided between the upper surface 82 of the frame 81, which is a feeding surface for feeding the component feeding tape 70, and the lower surface 155 of the supporting member 151 of the exposing unit 150 included in the tape guide 120. The space F is slightly smaller than the thickness of the component feeding tape 70.

As illustrated in FIG. 15, the arms 175 of the rotary member 171 lowers due to the weight balance and the lower surfaces of the arms 175 are in contact with the upper surface 82 of the frame 81. As further illustrated in FIG. 15, the lower edge of the lower surface 175 of the cover 173 is at the same height as the blade tip of the cutter blade 161. The cover 173 entirely covers the blade tip 163 of the cutter blade 161. The rotary member 171 is substantially in the horizontal position.

(B) During loading

To attach the component feeding tape 70 to the unattached feeder 80 to which the component feeding tape 70 is not attached, the component feeding tape 70 is inserted from the rear side of the feeder 80 to the tape path 83 and the automatic loader 100 is turned on. Along with the rotation of the third sprocket 101, the component feeding tape 70 is conveyed to the downstream side in the tape path 83.

The component feeding tape 70 conveyed through the tape path 83 reaches the upper surface 82 of the frame 81. After that, the component feeding tape 70 is conveyed between the tape guide 120 and the frame 81.

While the component feeding tape 70 is conveyed between the tape guide 120 and the upper surface 82 of the frame 81, the tape guide 120 and the exposing unit 150 are lifted due to the thickness of the component feeding tape 70. The space is provided between the rotary member 171 and the upper surface 82 of the frame 81.

Figure 16:
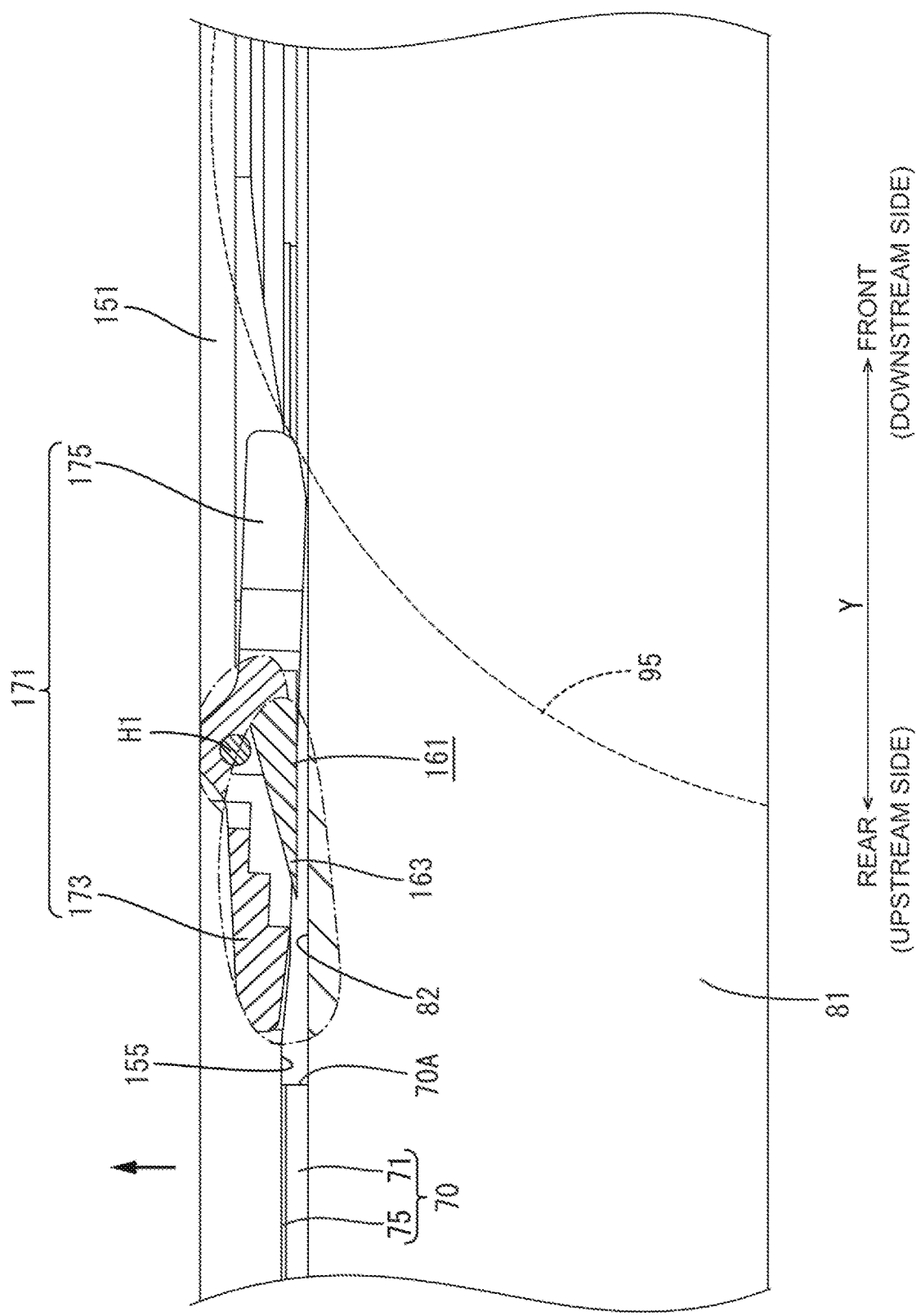
FIG. 16 is an elevated view of the upper portion of the feeder with a cross-sectional view in part.

The rotary member 171 rotates clockwise to lower the arms 175 by the space. As illustrated in FIG. 16, the cover 173 that covers the blade tip 163 is lifted and the blade tip 163 of the cutter blade 161 is exposed from the cover 173.

As illustrated in FIG. 17, the cover 173 is located above the second horizontal portion 155C of the supporting member 151. The lower edge of the lower surface 174 is located at the same height as the second horizontal portion 155C. When the front edge 70A of the tape 70 is fed to the exposing unit 150, the upper surface of the covering tape 75 of the component feeding tape 70 is pressed by the lower surface 155 of the supporting member 151.

The upper surface of the covering tape 75 is pressed by the first horizontal portion 155A while the front edge 70A of the tape 70 is passing through the first horizontal portion 155A. Then, the upper surface of the covering tape 75 is pressed by the sloped portion 155B while the front edge 70A of the tape 70 is passing through the sloped portion 155B.

The upper surface of the covering tape 75 is pressed by the second horizontal portion 155C while the front edge 70A of the tape 70 is passing through the second horizontal portion 155C.

Figure 18:
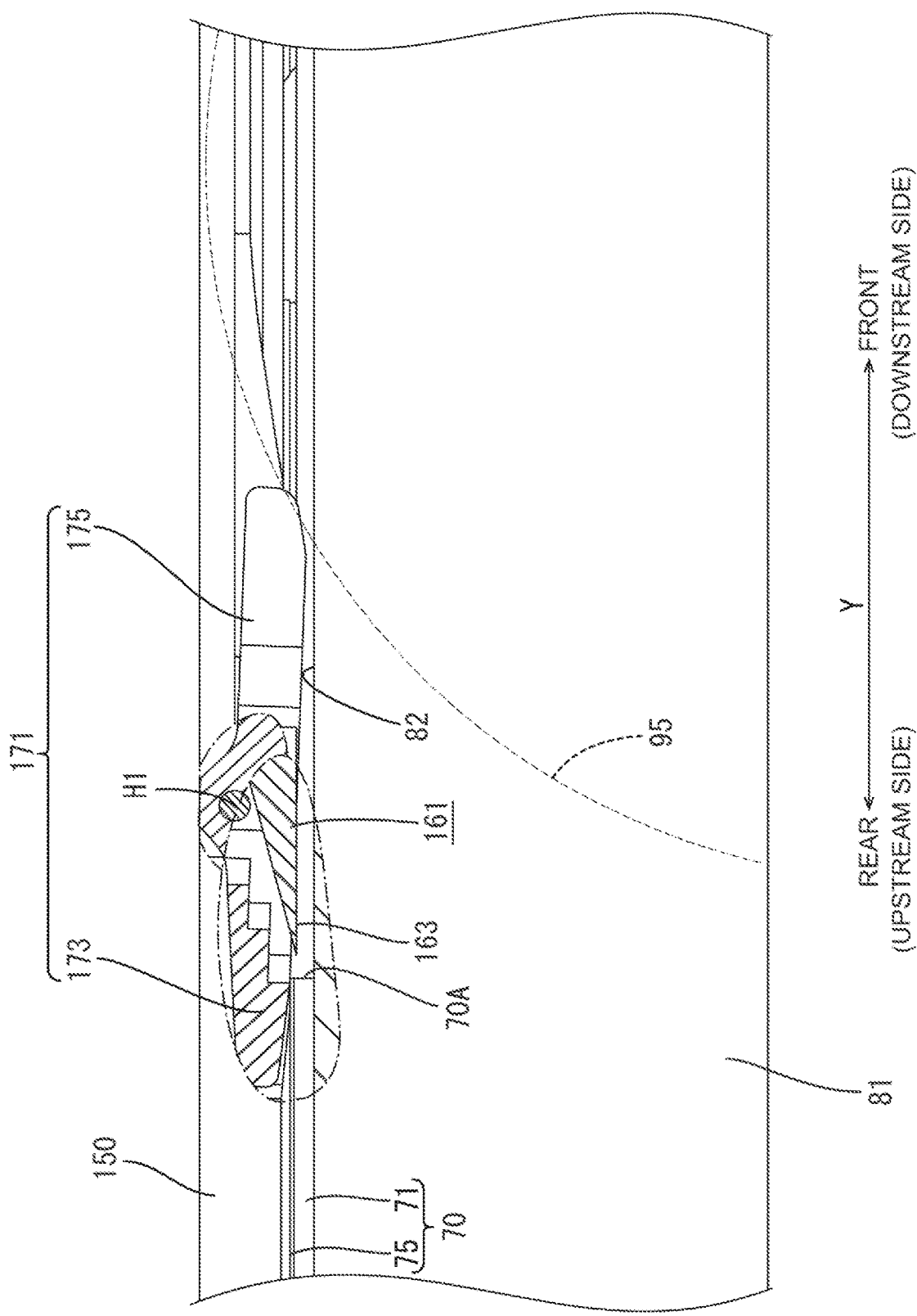
FIG. 18 is an elevated view of the upper portion of the feeder with a cross-sectional view in part.

As illustrated in FIGS. 17 and 18, the upper surface of the component feeding tape 70 is pressed by the second horizontal portion 155C immediately before the front edge 70A of the tape 70 reaches the blade tip 163 and conveyed to the downstream side.

Figure 19:
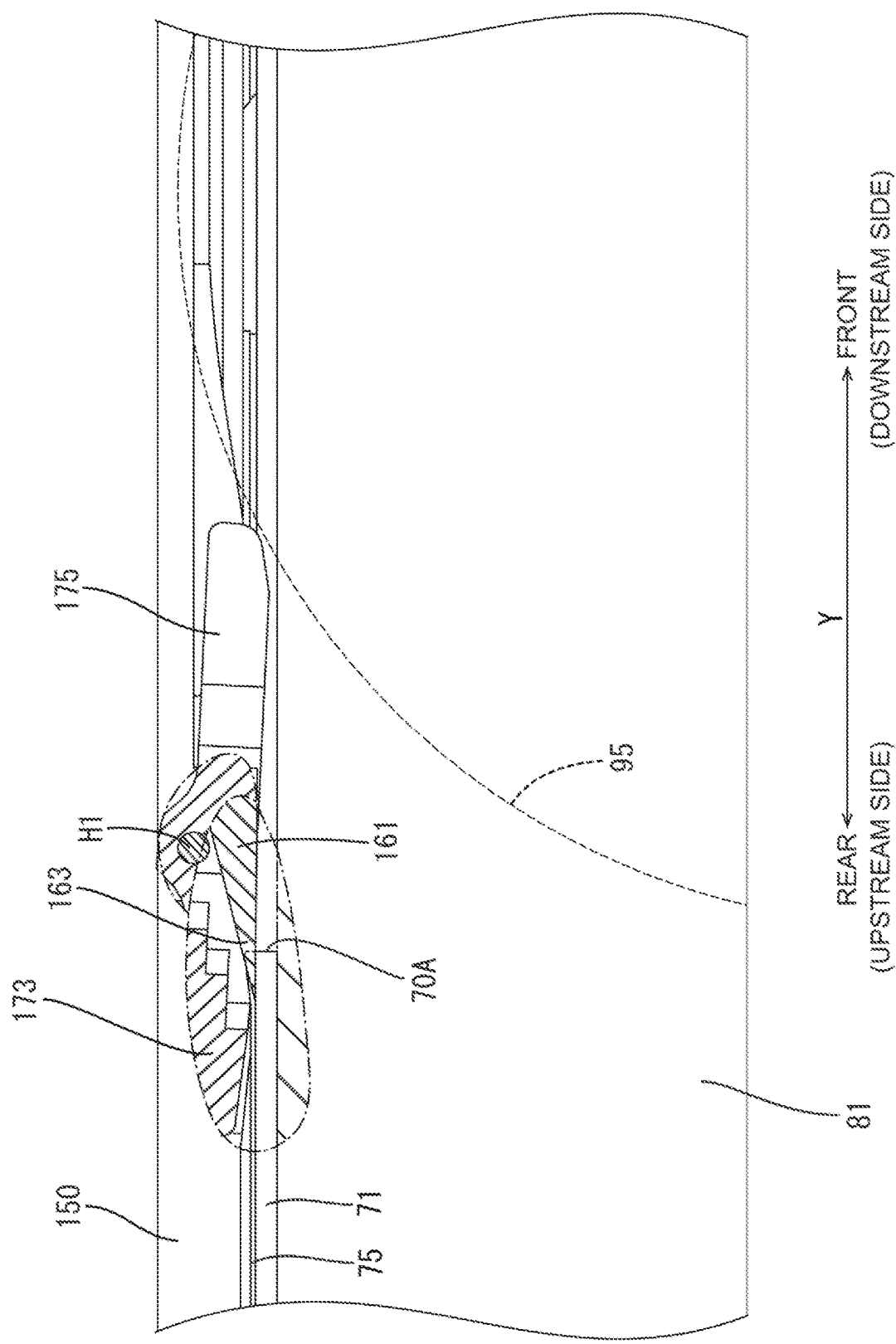
FIG. 19 is an elevated view of the upper portion of the feeder with a cross-sectional view in part.

As illustrated in FIGS. 17 and 18, when the cover 173 is lifted, the blade tip 163 of the cutter blade 161 is exposed from the cover 173. The blade tip 163 is located below the third horizontal portion 155C to project downward. When the front edge 70A of the tape 70 reaches the cutter blade 161, the blade tip 163 easily enters between the carrier tape 71 and the covering tape 75 as illustrated in FIG. 19.

The covering tape 75 is cut open as the component feeding tape 70 passes the cutter blade 161 and the electronic components W are exposed. When the front edge 70A of the tape 70 is fed further to the downstream side after passing the blade tip 163, the front edge 70A of the tape contacts the arms 175 of the rotary member 171. The rotary member 171 is pushed by the component feeding tape 70 and rotates counterclockwise. Therefore, the cover 173 of the rotary member 171 lowers.

Figure 20:
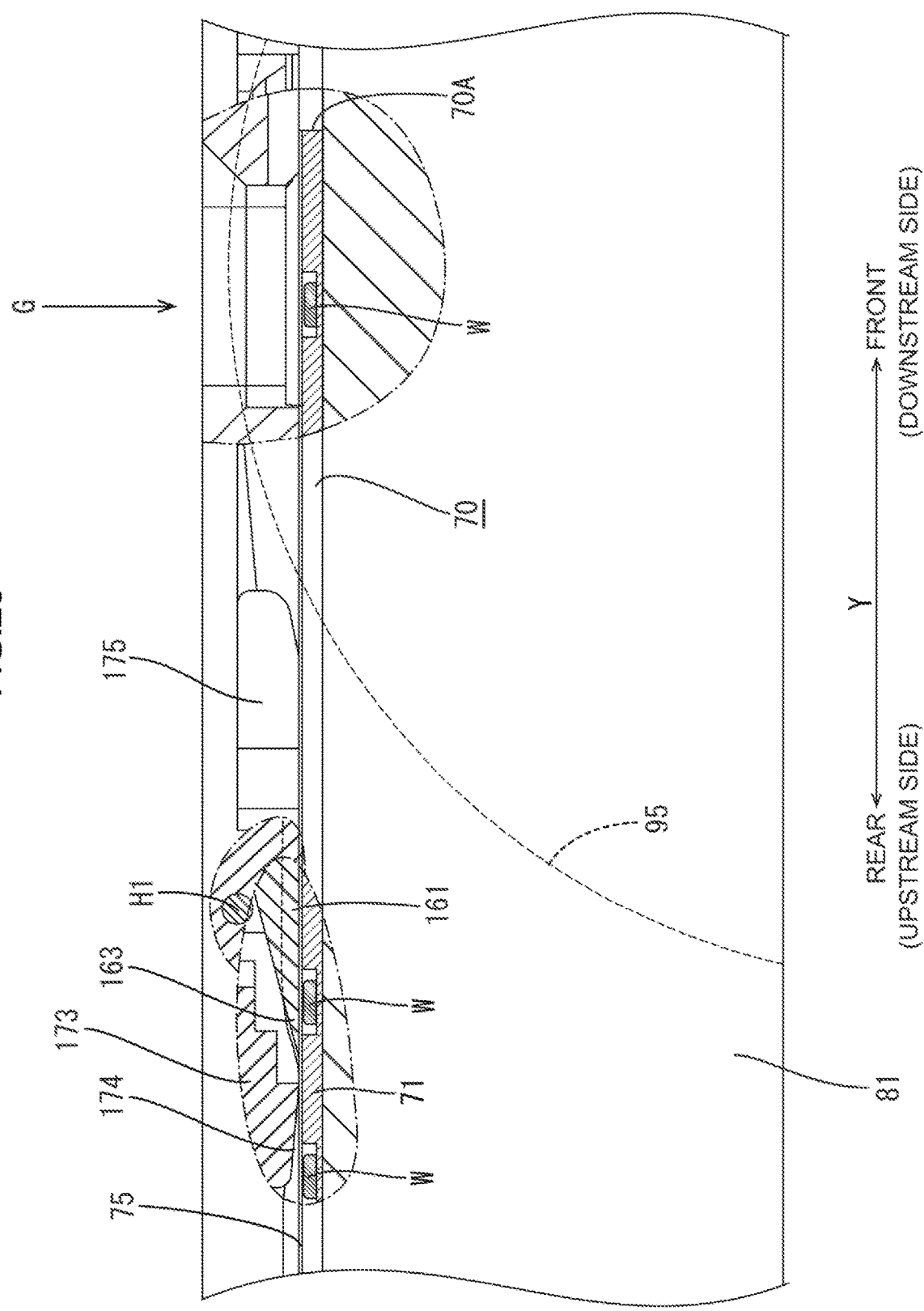
FIG. 20 is an elevated view of the upper portion of the feeder with a cross-sectional view in part.

As illustrated in FIG. 20, after the front edge 70A of the tape has passed the arms 175, the lower surface 174 of the cover 173 lowers to the blade tip 163 of the cutter blade 161 and the blade tip 163 of the cutter blade 161 is covered with the cover 173. When the first one of the electronic components W is fed to the component feeding position G, the loading of the component feeding tape 70 ends. At the end of the loading, the blade tip 163 of the cutter blade 161 is covered with the cover 173 as described above. In the normal operation after the loading, that is, during the feeding of the components to the component feeding position G by pitch-feeding the component feeding tape 70, the blade tip 163 of the cutter blade 161 is less likely to contact the electronic components W held in the component holding portions of the carrier tape 71.

Figure 21:
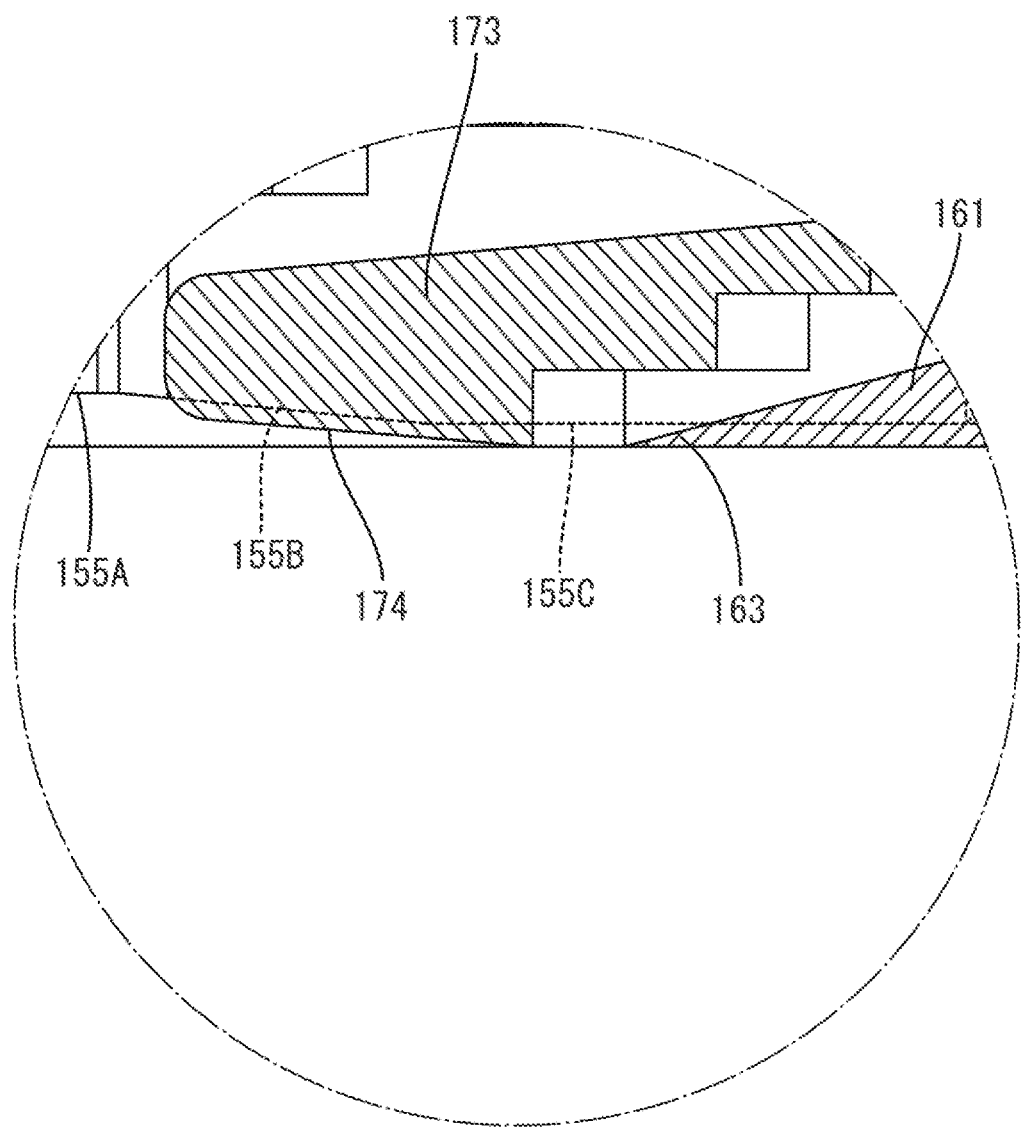
FIG. 21 is a cross-sectional view of portion D in FIG. 14.

Specifically, as illustrated in FIGS. 20 and 21, after the completion of the loading, the lower surface 174 of the cover 173 is located below the second horizontal portion 155C of the supporting member 151. Therefore, in the normal operation after the loading, the lower surface 174 of the cover 173 functions as a pressing surface to press the upper surface of the component feeding tape 70. The component feeding tape 70 is conveyed with the upper surface of the carrier tape pressed by the lower surface 174 of the cover 173. The lower surface 174 of the cover 173 covers the blade tip 163 of the cutter blade 161 and pushes the electronic components W held in the component holding portions 72 of the carrier tape 71 below the blade tip 163 of the cutter blade 161.

In the normal operation after the loading, that is, during the feeding of the electronic components W to the component feeding position G by pitch-feeding the component feeding tape 70, the blade tip 163 of the cutter blade 161 is less likely to contact the electronic components W held in the component holding portions 72 of the carrier tape 71. After the loading, the blade tip 163 of the cutter blade 161 is covered with the cover 173 as described earlier. After the blade tip 163 of the cutter blade 161 is inserted between the tapes, a section of the covering tape 75 corresponding to the blade tip 163 of the cutter blade 161 becomes loose. Once the blade tip 163 of the cutter blade 161 is inserted between the tapes, the blade tip of the cutter blade 161 remains between the tapes even after the blade tip 163 is covered with the cover 173.

As illustrated in FIG. 13, a groove 176 is provided between the arms 175 of the rotary member 171 to reduce contact with the cutter blade 161. The width of the electronic components W is defined less than the width H of the groove 176 so that the upper surfaces of the components are pressed by the lower surfaces of the arms 175. After the tape is cut open, the electronic components W that are exposed are less likely to rise to the cutter blade 161. Therefore, the electronic components W that are exposed are further less likely to contact the cutter blade 161.

If the electronic components W are smaller than the groove 176, the positions of the cutter blade 161 and the rotary member 171 may be shifted in the X direction that is perpendicular to the Y direction that corresponds with the tape feeding direction. The upper surfaces of the components can be pressed by one of the arms 175 and thus the electronic components W are less likely to contact the cutter blade 161.

3. Effects of the Embodiment

In the surface mounter 1 according to this embodiment, the blade tip 163 is projected from the pressing surface 155C during loading and thus the blade tip can be easily inserted between the tapes. During the normal operation, the blade tip 163 is not projected from the pressing surface 174 and thus the blade tip 163 of the cutter blade 161 is less likely to contact the electronic components W held in the component holding portions 72 of the carrier tape 71.

By pushing the rotary member 171 with the front edge 70A of the component feeding tape 70 to rotate, the projection amount of the cutter blade 161 from the pressing surface is adjusted. According to the configuration, a special driving source for rotating the rotary member 171 is not required for the adjustment of the projection amount.

Second Embodiment

In the first embodiment section, the configuration for adjusting the projection amount of the cutter blade 161 is described. A second embodiment has a configuration for adjusting the projection amount of cutter blade 161 different from the configuration of the first embodiment.

As illustrated in FIG. 22, a feeder 200 includes a frame 210 including a tape path 213, a first sprocket 95, a second sprocket 97, a third sprocket 101, and a tape guide 250.

The sprockets 95, 97, and 101 rotate through driving by a motor, which is not illustrated to convey the component feeding tape 70. The functions of the sprockets 95, 97, and 101 are similar to those of the first embodiment. The sprocket 95 is for driving. The sprocket 97 is for pushing. The sprocket 101 is for automatic loading.

The tape guide 250 includes a guide body 251 and a cutter blade 270. The guide body 251 presses the upper surface of the component feeding tape 70 conveyed on the upper surface of the frame 210. The tape guide 250 is disposed on the upper surface of the front section of the frame 210. The lower surface L1 of the guide body 251 of the tape guide 250 is a pressing surface that presses the upper surface of the component feeding tape 70 (the upper surface of the covering tape).

Figure 23A:
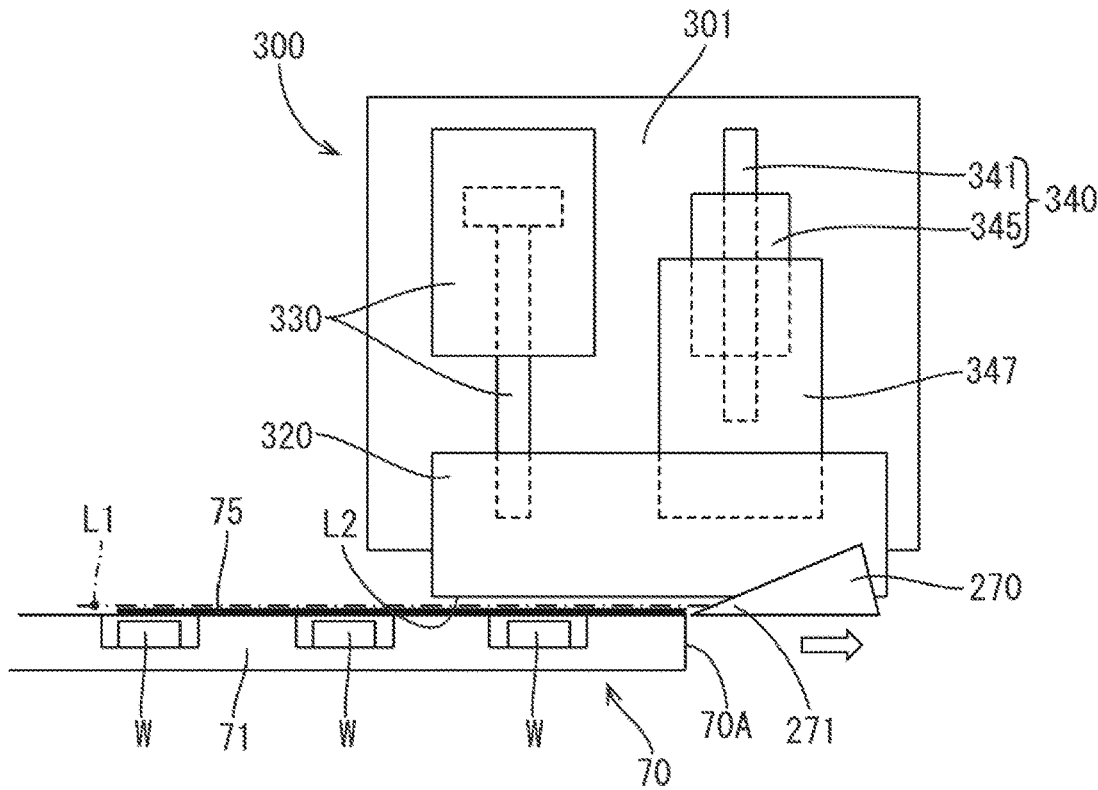
FIGS. 23A and 23B are elevated views illustrating a structure of an adjustment portion.
Figure 23B:
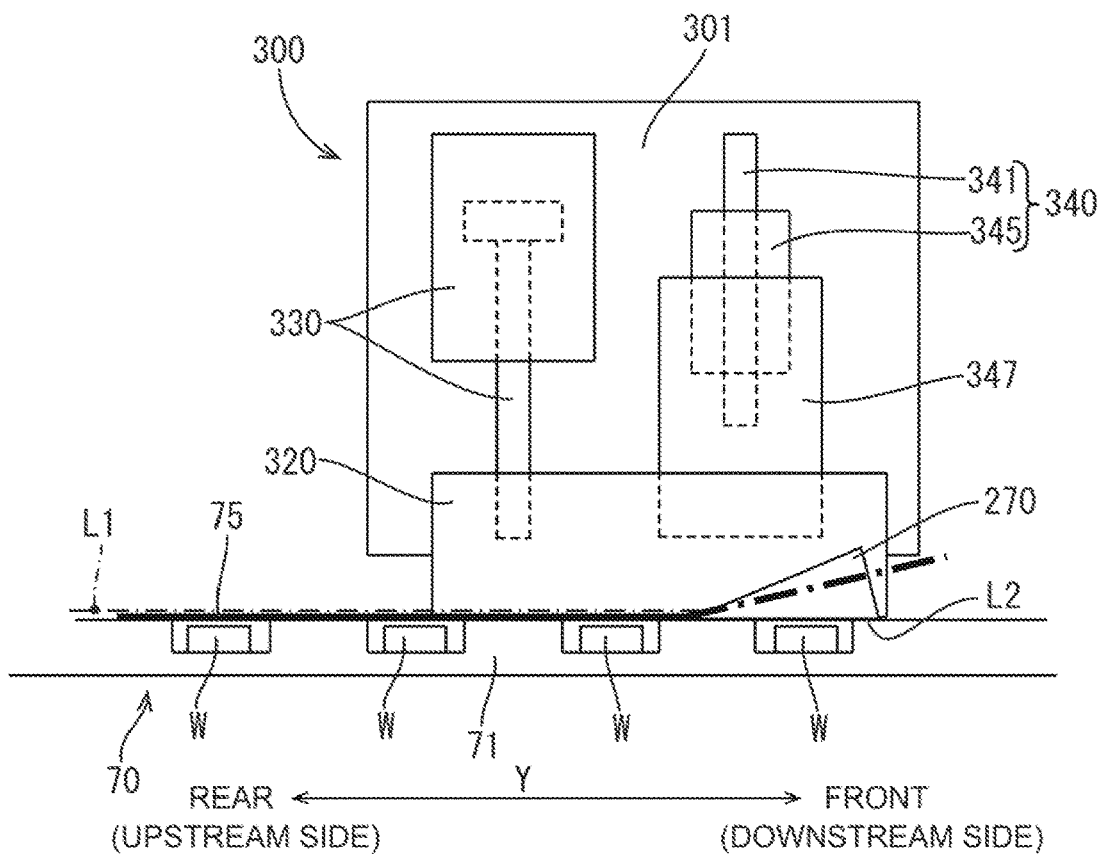

As illustrated in FIGS. 22, 23A and 23B, the cutter blade 270 has a triangular shape. The cutter blade 270 is fixed to the lower section of the guide body 251 of the tape guide 250 with the blade tip 271 facing the upstream side of the tape feeding direction (the left side in FIG. 22). The position of the cutter blade 270 relative to the guide body 251 is not changeable. The cutter blade 270 cuts the covering tape 75 open at a position on the upstream side relative to the component feeding position G to expose the electronic components W held in the carrier tape 71.

The tape guide 250 includes an adjustment portion 300. The adjustment portion 300 is fixed to the frame 210 with the arms 280. The adjustment portion 300 includes a blade cover 320, a linear guide 340, and a driving air cylinder 330. The adjustment portion 300 adjusts a projection amount of the cutter blade 310 from the pressing surface L of the component feeding tape 70.

Specifically, the blade cover 320 has a rectangular shape. As illustrated in FIGS. 23A and 23B, a front half of the cover entirely covers the cutter blade 270 in the tape feeding direction (the Y direction). The linear guide 340 includes a rail 341 and a slider 345 that slides along the rail 31. The blade cover 320 is fixed to the slider 345 of the linear guide 340 via a connecting member 347. By driving the air cylinder 330, the blade cover 320 can be moved in the vertical direction with guiding operation by the linear guide 340.

As illustrated in FIG. 23A, the blade cover 320 during loading is located above the lower surface L1 of the guide body 251 of the tape guide 250. The blade tip of the cutter blade 310 projects downward from the lower surface L1 of the guide body 251 of the tape guide 250 (the pressing surface of the tape). Therefore, when the front edge 70A of the component feeding tape 70 passes the cutter blade 310, the blade tip of the cutter blade 310 easily enters between the carrier tape 71 and the covering tape 75.

As illustrated in FIG. 23B, during the normal operation after the loading, the blade cover 320 is lowered and located below the lower surface L1 of the guide body 251 of the tape guide 250. During the normal operation, the lower surface L2 of the blade cover 320 is a pressing surface to press the upper surface of the component feeding tape 70.

As illustrated in FIG. 23B, when the blade cover 320 is lowered, the lower surface L2 of the blade cover 320 is at the same height as the lower surface of the cutter blade 310. The blade tip of the cutter blade 310 is not projected downward from the lower surface L2 of the blade cover 320.

Similar to the first embodiment, during the normal operation after the loading, the blade tip of the cutter blade 310 is less likely to contact the electronic component W held in the component holding portions 72 of the carrier tape 71. In FIGS. 23A and 23B, the tape guide 250 and the guide body 251 are omitted.

Third Embodiment

In the second embodiment section, the configuration in which the projection amount of the cutter blade 310 is adjusted by moving the blade cover 320 in the vertical direction is described.

In a third embodiment, a projection amount of a cutter blade 410 from the lower surface L1 of the guide body 251 of the tape guide 250 (the pressing surface of the component feeding tape 70) is adjusted by moving the cutter blade 410 in the vertical direction. Specifically, an adjustment portion for adjusting the projection amount of the cutter blade 410 includes a base 431, a motor 440, a pinion gear 450, a rack gear 460, and a linear guide 470.

Figure 24:
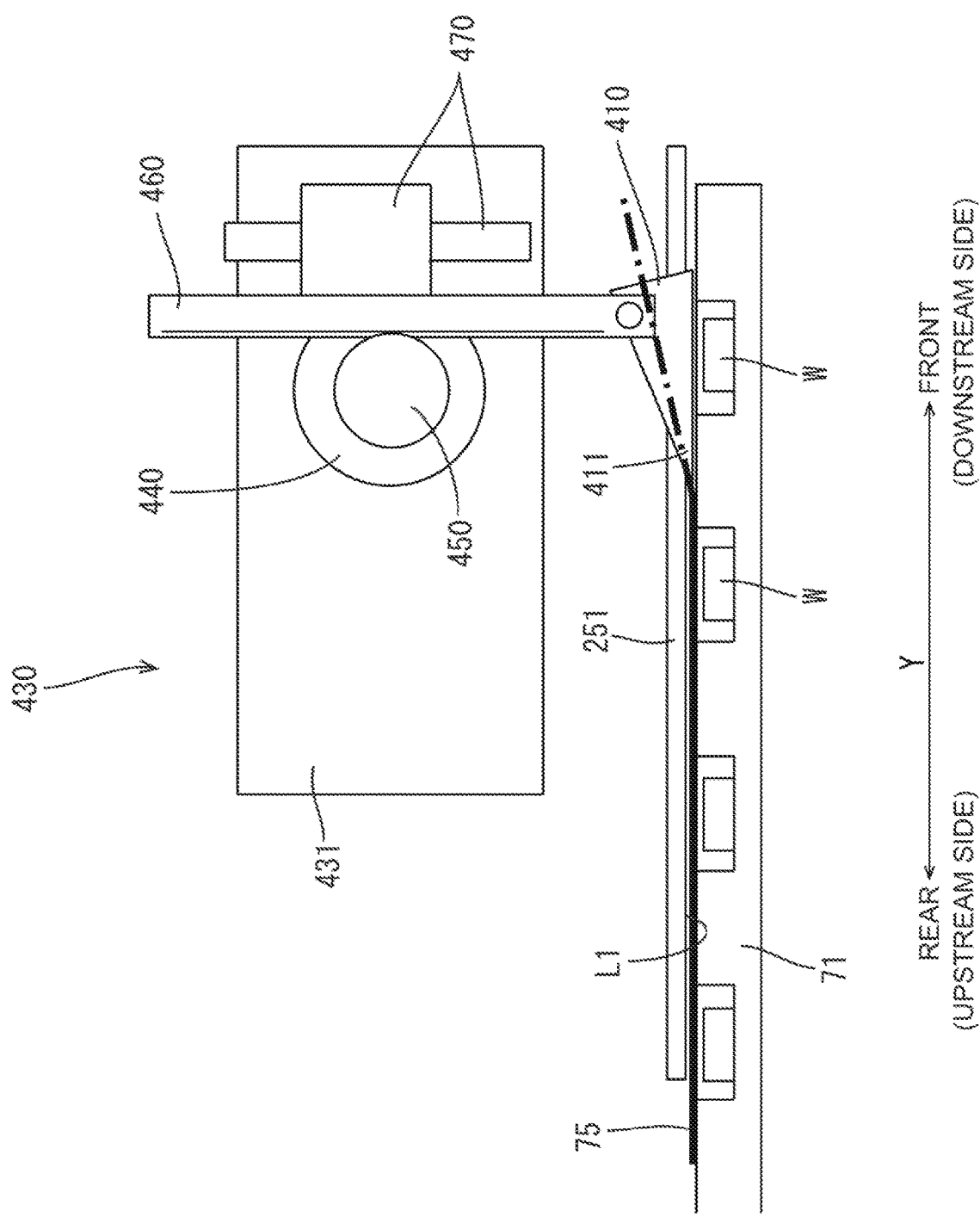
FIG. 24 is an elevated view of an adjustment portion in a third embodiment.

As illustrated in FIG. 24, the upper end of the cutter blade 410 is fixed to the rack gear 460. The rack gear 460 is engaged with the pinion gear 450 and configured to rotate when the motor 440 is turned on.

When the motor 440 is turned on, the rack gear 460 moves in the vertical direction along with rotation of the pinion gear 450. Therefore, the cutter blade 410 is moved in the vertical direction. The projection amount of the cutter blade 410 from the lower surface L1 of the guide body 251 of the tape guide 250 (the pressing surface of the component feeding tape 70) can be adjusted.

During loading, the cutter blade 410 is lowered to increase the projection amount of the cutter blade 410 from the lower surface L1 of the guide body 251 of the tape guide 250. During the normal operation after the loading, the cutter blade 410 is raised to reduce the projection amount of the cutter blade 410 from the lower surface L1 of the guide body 251 of the tape guide 250.

According to the configuration, a blade tip 411 of the cutter blade 410 can easily enter between the carrier tape 71 and the covering tape 75. During the normal operation after the loading, the blade tip 411 of the cutter blade 410 is less likely to contact the electronic components W held in the component holding portions 72 of the carrier tape 71. The linear guide 470 is provided to stabilize the vertical movement of the rack gear 460 and the cutter blade 410.

Fourth Embodiment

In the third embodiment section, the pinion gear 430 and the rack gear 440 are used to move the cutter blade 410 in the vertical direction.

In a fourth embodiment, a link mechanism 500 is used to move a cutter blade 559 in the vertical direction. The link mechanism 500 includes a first link 510 and a second link 520. As illustrated in FIGS. 25A and 25B, a cutter blade 550 is supported by a supporting plate 501 via the links 510 and 520 to be movable in the vertical direction.

As illustrated in FIG. 25A, the cutter blade 550 is below the lower surface L1 of the tape guide 250 (the pressing surface of the component feeding tape) due to the weight thereof before the front edge of the tape reaches the blade tip 551 during loading. The blade tip 551 of the cutter blade 550 can easily enter between the carrier tape 71 and the covering tape 75. At this time, the cutter blade 550 is tilted. The lower surface 553 is not leveled and is sloped toward the front.

As illustrated in FIG. 25B, when the front edge 70A of the component feeding tape 70 that is fed contacts the lower surface 553 of the cutter blade 550, the cutter blade 550 is lifted. Therefore, the projection amount of the cutter blade 550 from the lower surface L1 of the tape guide 250 (the pressing surface of the component feeding tape) decreases. During the normal operation after the loading, the blade tip 551 of the cutter blade 550 is less likely to contact the electronic components W held in the component holding portions 72 of the carrier tape 71.

Other Embodiments

The technology disclosed herein is not limited to the embodiments described above and illustrated by the drawings. For example, the following embodiments may be included in the technical scope.

To expose the electronic components from the carrier tape, a cut-open method including inserting the blade tip between the tapes and cutting a section of the covering tape open or a removal method including inserting the blade tip between the tapes and removing a section of the covering tape from the carrier tape may be used.

In the first to the fourth embodiment sections, the present disclosure is applied to the feeders that use the cut-open method. However, the present disclosure may be applied to feeders that use the removal method. In the removal method, the blade tip or a tip of another type of member is inserted between the tapes to expose the components. Therefore, by adjusting the projection amount of a blade tip of a removing member using the method described in the embodiment sections, the glade tip of the removing member is less likely to contact the electronic components held in the component holding portions 72 of the carrier tape 71.

What is claimed is:

1. A component feeder for feeding components to a component feeding position using a component feeding tape including a carrier tape holding the components at equal intervals and a covering tape attached to an upper surface of the carrier tape, the component feeder comprising:
    a driving sprocket configured to feed the component feeding tape to the component feeding position; and
    a tape guide comprising:
        a guide body including a pressing surface to press an upper surface of the component feeding tape fed to the component feeding position;
        a component exposer configured to expose the components in the component feeding tape fed to the component feeding position, the component exposer including an inserter configured for insertion between the carrier tape and the covering tape; and
        an adjuster configured to adjust a projection amount of the inserter from the pressing surface.

2. The component feeder according to claim 1, further comprising a loading sprocket configured to feed a front edge of the component feeding tape to the driving sprocket, wherein
    the adjuster is configured to:
        increase the projection amount of the inserter from the pressing surface during loading of the component feeding tape to the component feeder to which the component feeding tape is not loaded, and
        reduce the projection amount of the inserter from the pressing surface after the loading.

3. The component feeder according to claim 2, wherein the tape guide comprises:
    the component exposer fixed to the guide body; and
    a movable member movable relative to the guide body, and
    the movable member includes a pressing surface to press an upper surface of the component feeding tape on an upstream side relative to the inserter of the component exposer, and is configured to adjust a projection amount of the inserter from the pressing surface of the movable member by moving the movable member relative to the guide body.

4. The component feeder according to claim 3, wherein the movable member moves in a direction to reduce the projection amount when pushed by the front edge of the component feeding tape that is moved toward the component feeding position.

5. The component feeder according to claim 4, wherein the movable member includes a rotator that is rotatable about a rotation axis relative to the guide body.

6. The component feeder according to claim 5, wherein
the component exposer comprises a cutter blade including a blade tip to be inserted between the carrier tape and the covering tape,
the cutter blade is configured to cut the covering tape open to expose the components at the component feeding position,
the rotator comprises:
   a cover disposed on an upstream side relative to the rotation axis, covering a section of the cutter blade on the upstream side, and including a lower surface configured as a pressing surface to press the upper surface of the component feeding tape; and
   two arms disposed on a downstream side relative to the rotation axis and covering sides of the cutter blade, and
the lower surface of the cover lowers when the front edge of the component feeding tape contacts the arms and the rotator rotates to reduce a projection amount of the cutter blade.

7. The component feeder according to claim 6, wherein the rotation axis of the rotator is located on the downstream side relative to the blade tip and above the blade tip.

8. The component feeder according to claim 1, wherein the tape guide comprises:
   the component exposer fixed to the guide body; and
   a movable member movable relative to the guide body, and
   the movable member includes a pressing surface to press an upper surface of the component feeding tape on an upstream side relative to the inserter of the component exposer, and is configured to adjust a projection amount of the inserter from the pressing surface of the movable member by moving the movable member relative to the guide body.

9. The component feeder according to claim 8, wherein the movable member moves in a direction to reduce the projection amount when pushed by a front edge of the component feeding tape that is moved toward the component feeding position.

10. The component feeder according to claim 9, wherein the movable member includes a rotator that is rotatable about a rotation axis relative to the guide body.

11. The component feeder according to claim 10, wherein
the component exposer comprises a cutter blade including a blade tip to be inserted between the carrier tape and the covering tape,
the cutter blade is configured to cut the covering tape open to expose the components at the component feeding position,
the rotator comprises:
   a cover disposed on an upstream side relative to the rotation axis, covering a section of the cutter blade on the upstream side, and including a lower surface configured as a pressing surface to press the upper surface of the component feeding tape; and
   two arms disposed on a downstream side relative to the rotation axis and covering sides of the cutter blade, and
the lower surface of the cover lowers when the front edge of the component feeding tape contacts the arms and the rotator rotates to reduce a projection amount of the cutter blade.

12. The component feeder according to claim 11, wherein the rotation axis of the rotator is located on the downstream side relative to the blade tip and above the blade tip.

* * * * *